(12) United States Patent
Chang et al.

(10) Patent No.: US 12,550,370 B2
(45) Date of Patent: Feb. 10, 2026

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Shang-Wen Chang, Jhubei (TW); Li-Zhen Yu, New Taipei (TW); Lin-Yu Huang, Hsinchu (TW); Huan-Chieh Su, Tianzhong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 717 days.

(21) Appl. No.: 17/876,331

(22) Filed: Jul. 28, 2022

(65) Prior Publication Data

US 2023/0343838 A1 Oct. 26, 2023

Related U.S. Application Data

(60) Provisional application No. 63/334,490, filed on Apr. 25, 2022.

(51) Int. Cl.
*H10D 30/67* (2025.01)
*H10D 30/01* (2025.01)
*H10D 30/43* (2025.01)
*H10D 62/10* (2025.01)
*H10D 64/01* (2025.01)

(52) U.S. Cl.
CPC ....... *H10D 30/6729* (2025.01); *H10D 30/014* (2025.01); *H10D 30/031* (2025.01); *H10D 30/43* (2025.01); *H10D 30/6735* (2025.01); *H10D 30/6757* (2025.01); *H10D 62/121* (2025.01); *H10D 64/01* (2025.01); *H10D 64/017* (2025.01)

(58) Field of Classification Search
None
See application file for complete search history.

(56) References Cited

U.S. PATENT DOCUMENTS 10,170,414 B2  1/2019 Hu et al.
2010/0052065 A1  3/2010 Diaz et al.
(Continued)

FOREIGN PATENT DOCUMENTS

TW 201727903 A 8/2017

*Primary Examiner* — Nilufa Rahim
(74) *Attorney, Agent, or Firm* — STUDEBAKER BRACKETT PLLC

(57) ABSTRACT

In a method of manufacturing a semiconductor device, a field effect transistor (FET) having a metal gate structure, a source and a drain over a substrate is formed. A first frontside contact disposed between dummy metal gate structures is formed over an isolation insulating layer. A frontside wiring layer is formed over the first frontside contact. A part of the substrate is removed from a backside of the substrate so that a bottom of the isolation insulating layer is exposed. A first opening is formed in the isolation insulating layer from the bottom of the isolation insulating layer to expose a bottom of the first frontside contact. A first backside contact is formed by filling the first opening with a conductive material to connect the first frontside contact.

20 Claims, 45 Drawing Sheets

(56) References Cited

U.S. PATENT DOCUMENTS

| | | | |
|---|---|---|---|
| 2021/0376076 A1* | 12/2021 | Su | H10D 30/014 |
| 2021/0384311 A1 | 12/2021 | Wu et al. | |
| 2022/0052157 A1* | 2/2022 | Chang | H10D 64/256 |
| 2022/0157723 A1* | 5/2022 | Park | H01L 23/5286 |
| 2022/0246742 A1* | 8/2022 | Pal | H10D 64/017 |
| 2023/0100113 A1* | 3/2023 | Xie | H01L 21/76897 |
| | | | 257/774 |
| 2023/0197569 A1* | 6/2023 | Dewey | H10D 62/118 |
| | | | 257/401 |
| 2023/0299000 A1* | 9/2023 | Xie | H01L 23/5286 |
| | | | 257/401 |
| 2024/0096891 A1* | 3/2024 | Xie | H10D 62/151 |

\* cited by examiner

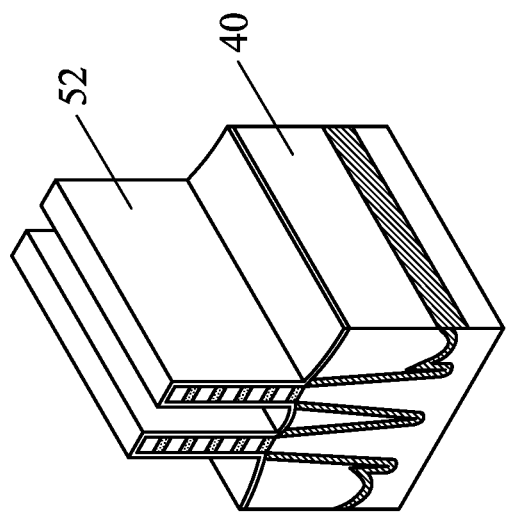
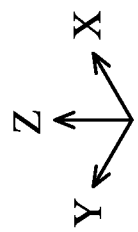
FIG. 9
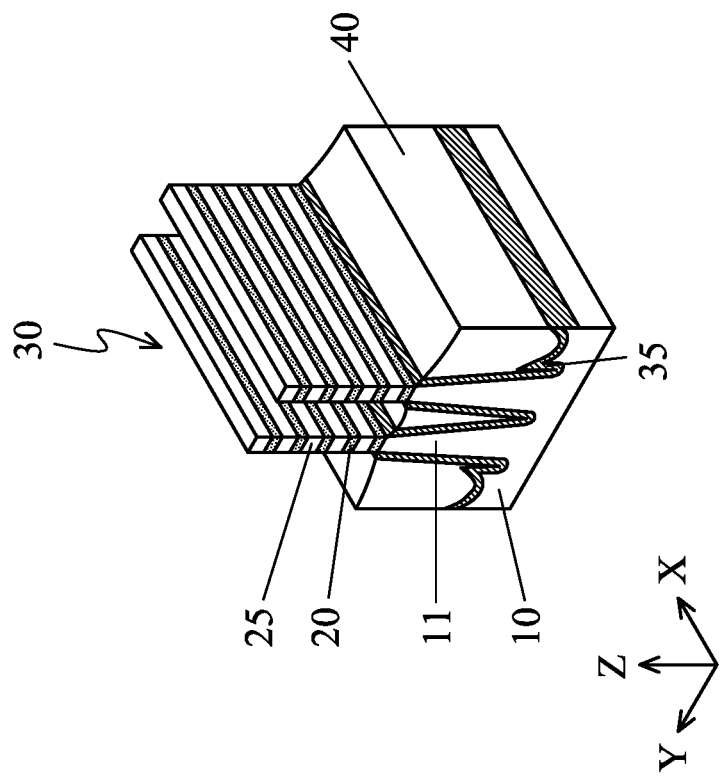
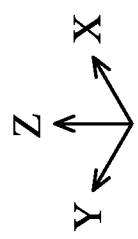
FIG. 8

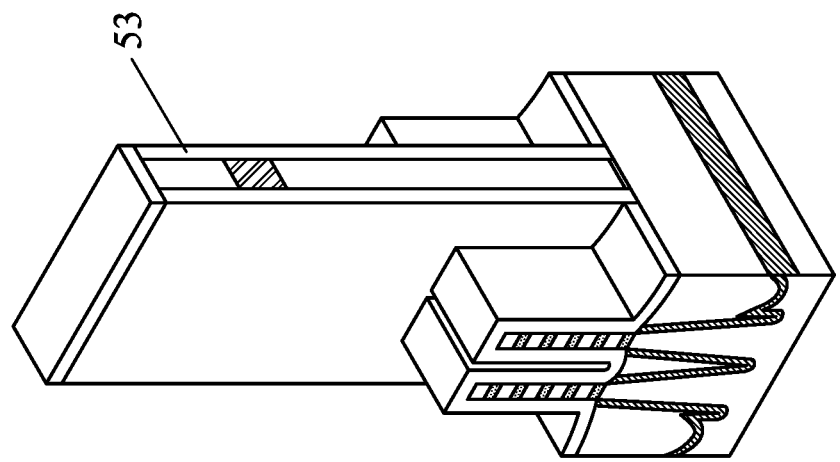
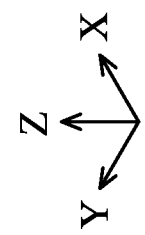
FIG. 11
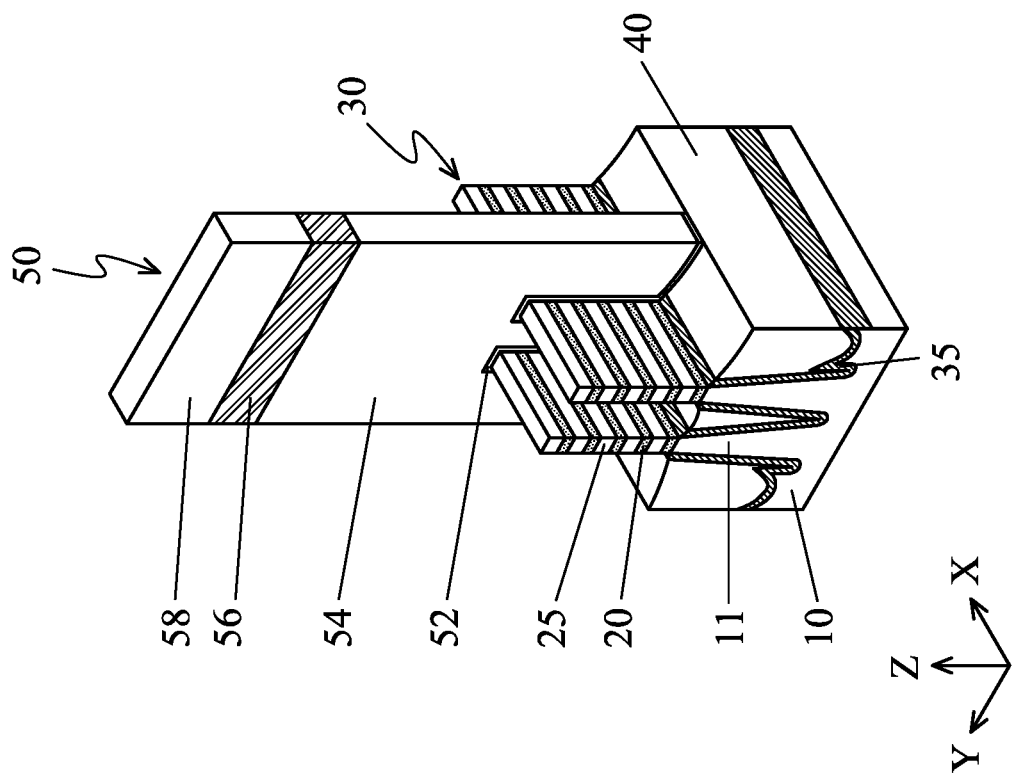
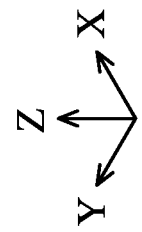
FIG. 10

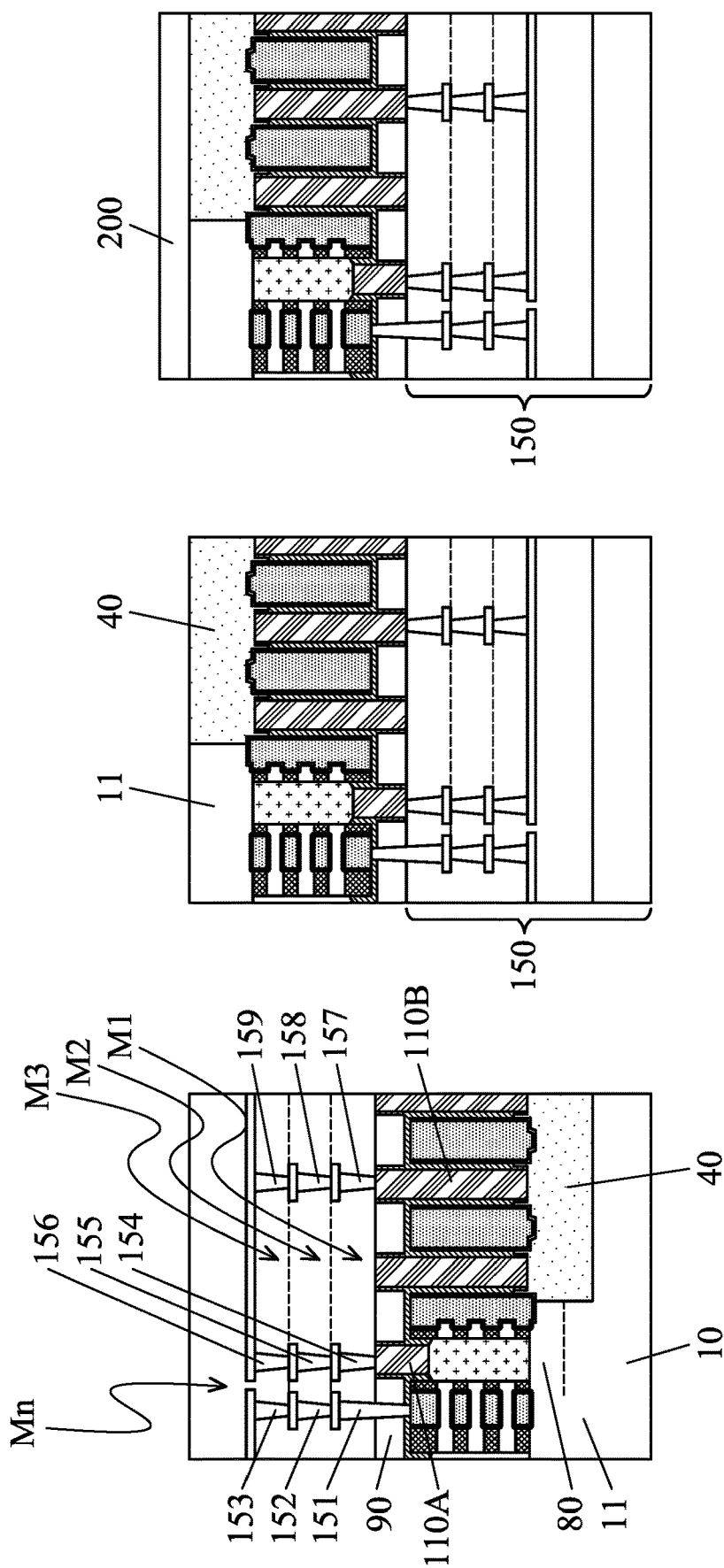

SEMICONDUCTOR DEVICE AND MANUFACTURING METHOD THEREOF

RELATED APPLICATIONS

This application claims priority to U.S. Provisional Patent Application No. 63/334,490 filed Apr. 25, 2022, the entire content of which is incorporated herein by reference.

BACKGROUND

As the size of semiconductor devices becomes smaller, a backside of a semiconductor substrate is used for placing conductive patterns coupled to conductive patterns formed on or over the front surface of the substrate by through-silicon-via (TSV) or other connecting patterns. The backside conductive patterns generally have a greater width and/or thickness than the frontside conductive patterns and thus provide lower electrical resistance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4, 5, 6, 7, 8, 9, 10 and 11 show schematic views of various stages of a sequential manufacturing operation of a semiconductor device according to an embodiment of the present disclosure.

FIGS. 21A, 21B and 21C show schematic views of the various stages of a sequential manufacturing operation of a semiconductor device according to an embodiment of the present disclosure.

DETAILED DESCRIPTION

Figure 1A:
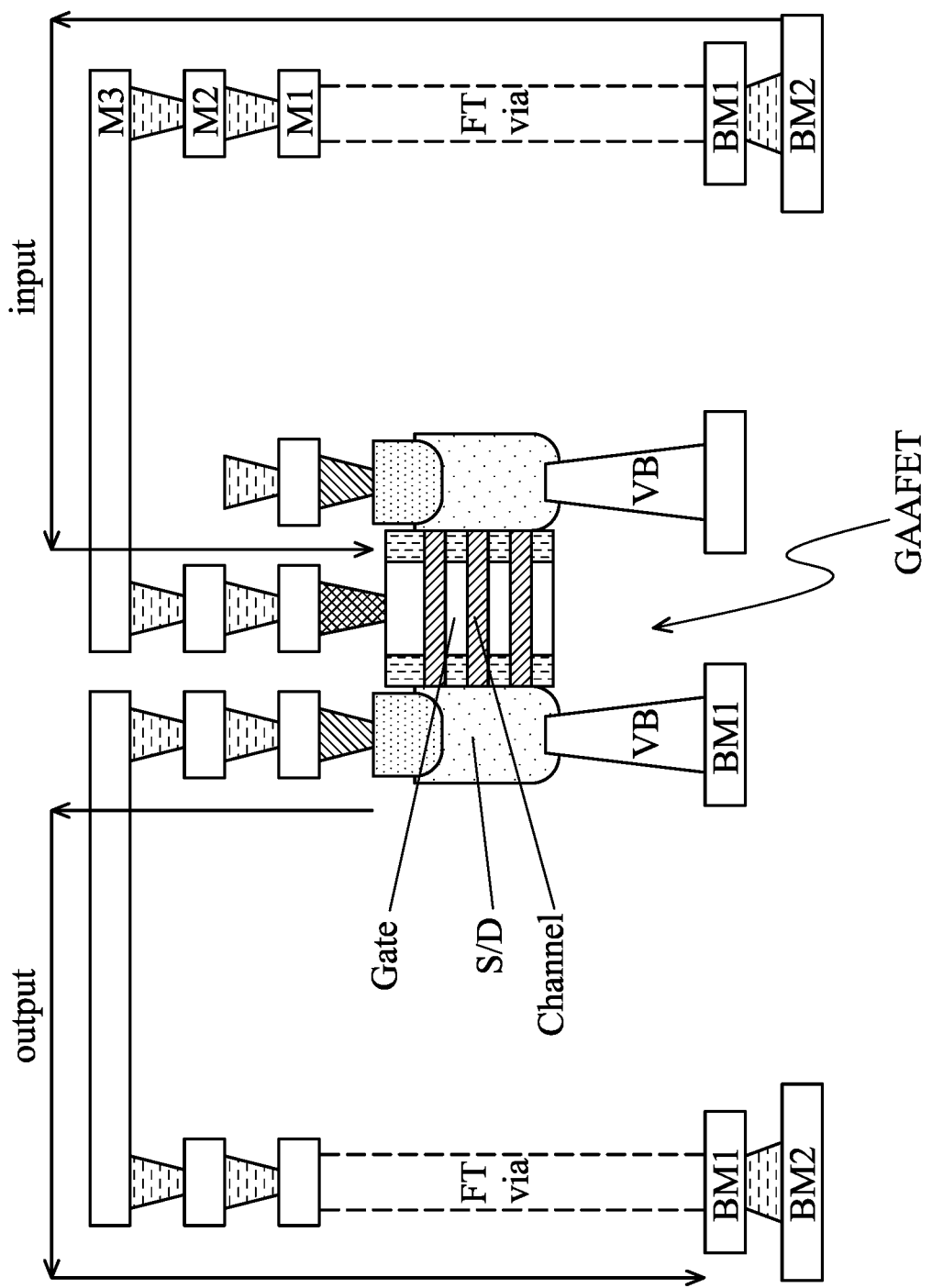
FIGS. 1A, 1B, 1C, 1D and 1E show circuit diagrams of a semiconductor device according to embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the following embodiments, the term "upper" "over" and/or "above" are defined along directions with an increase in a distance from the front surface and the back surface. Materials, configurations, dimensions, processes and/or operations as explained with respect to one embodiment may be employed in the other embodiments, and the detailed description thereon may be omitted.

In this disclosure, a semiconductor device includes a semiconductor substrate, a front side circuit disposed over a front surface of the substrate, and a back side circuit disposed over a back surface of the substrate. The front side circuit includes field effect transistors (FETs), such as fin FETs (FinFETs) and gate-all-around FETs (GAA FETs), and other electronic devices and lateral and vertical wiring patterns.

According to some embodiments of the present disclosure, an output signal from a FET (e.g., complementary metal-oxide-semiconductor (CMOS) FET) is routed to an input of a FET through a frontside wiring pattern disposed over the FETs and a backside wiring pattern formed over a backside of the substrate.

Figure 1B:
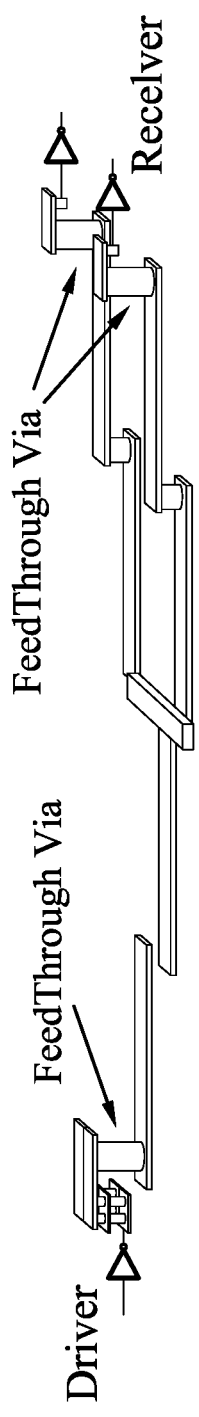
Figure 1C:
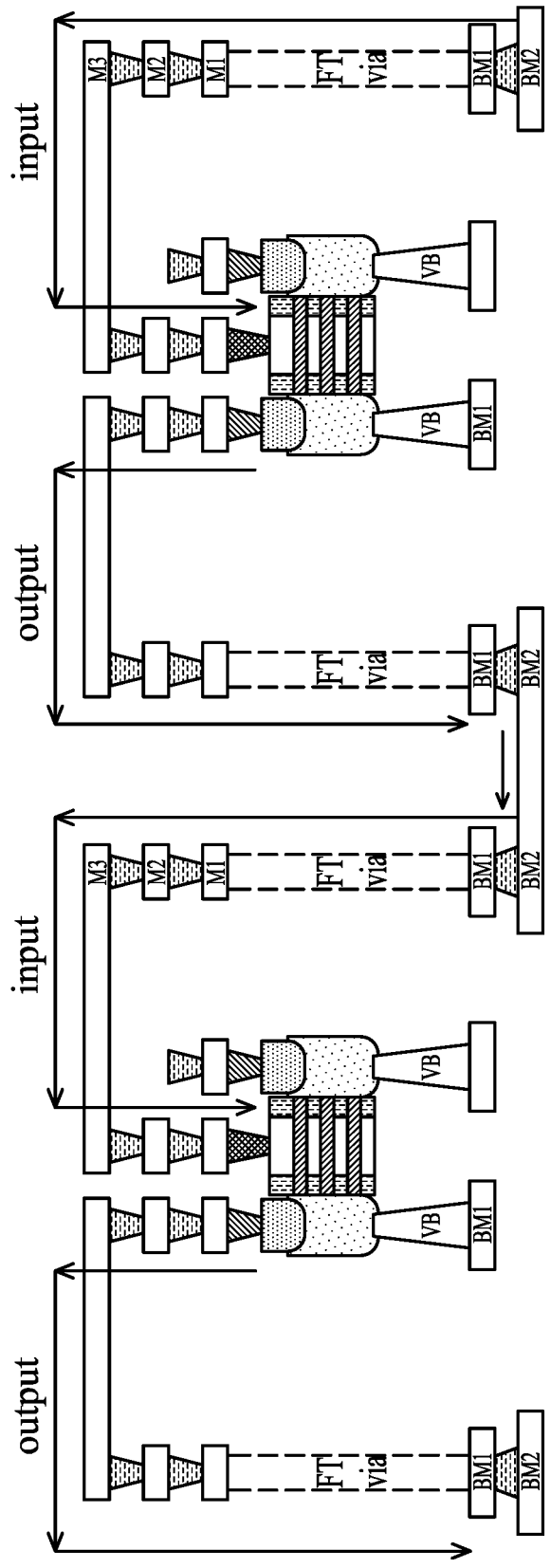

FIGS. 1A-1E show schematic circuit diagrams of a semiconductor device according to embodiments of the present disclosure. In some embodiments, a FET is a GAA FET having a plurality of semiconductor sheets or wires as channels, and a gate including a gate dielectric layer and a gate electrode layer wrapping around each of the channels and a source/drain (a source and/or a drain). An input signal is applied to the gate and an output signal is output from a drain (or a source). As shown in FIGS. 1A-1C, the input signal to the FET (a receiver cell), which is output from another FET (a driver cell), is routed through a backside wiring structure including a first backside wiring layer BM1 and a second backside wiring layer BM2 coupled to the first backside wiring layer by a via, a feedthrough via (FT via), and a frontside wiring structure including a first frontside wiring layer M1, a second front side wiring layer M2 and a third frontside wiring layer M3. In some embodiments, the output signal from one FET is routed by the frontside wiring layers M1, M2 and M3, the feedthrough via and the backside wiring layers BM1 and BM2. In this disclosure, an FT via transmits a signal (logic signal) and is different from a mere power supply line (e.g., input power (Vdd or Vss) to a source).

Figure 1D:
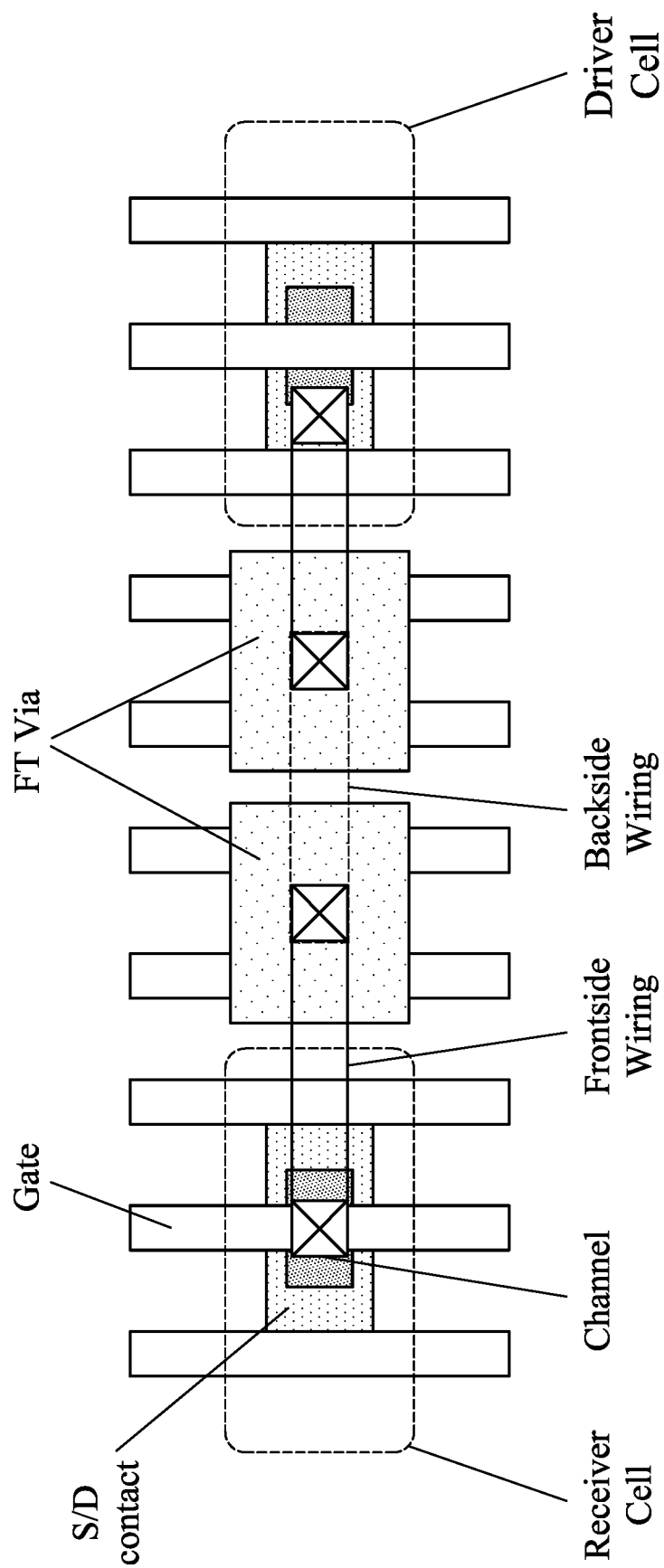

FIG. 1D shows a schematic layout view corresponding to FIG. 1C according to an embodiment of the present disclosure. The signal from a drain of the driver cell (driver FET) is routed to one or more frontside wirings (M1, M2) and to the backside by an FT via. One or more backside wirings receive the signal from the FT via, and send the signal to the frontside wiring by another FT via. The signal from the backside is input to a gate of the receiver cell (receiver FET). In some embodiments, at least one of the driver cell and the received cell is a CMOS invertor.

Figure 1E:
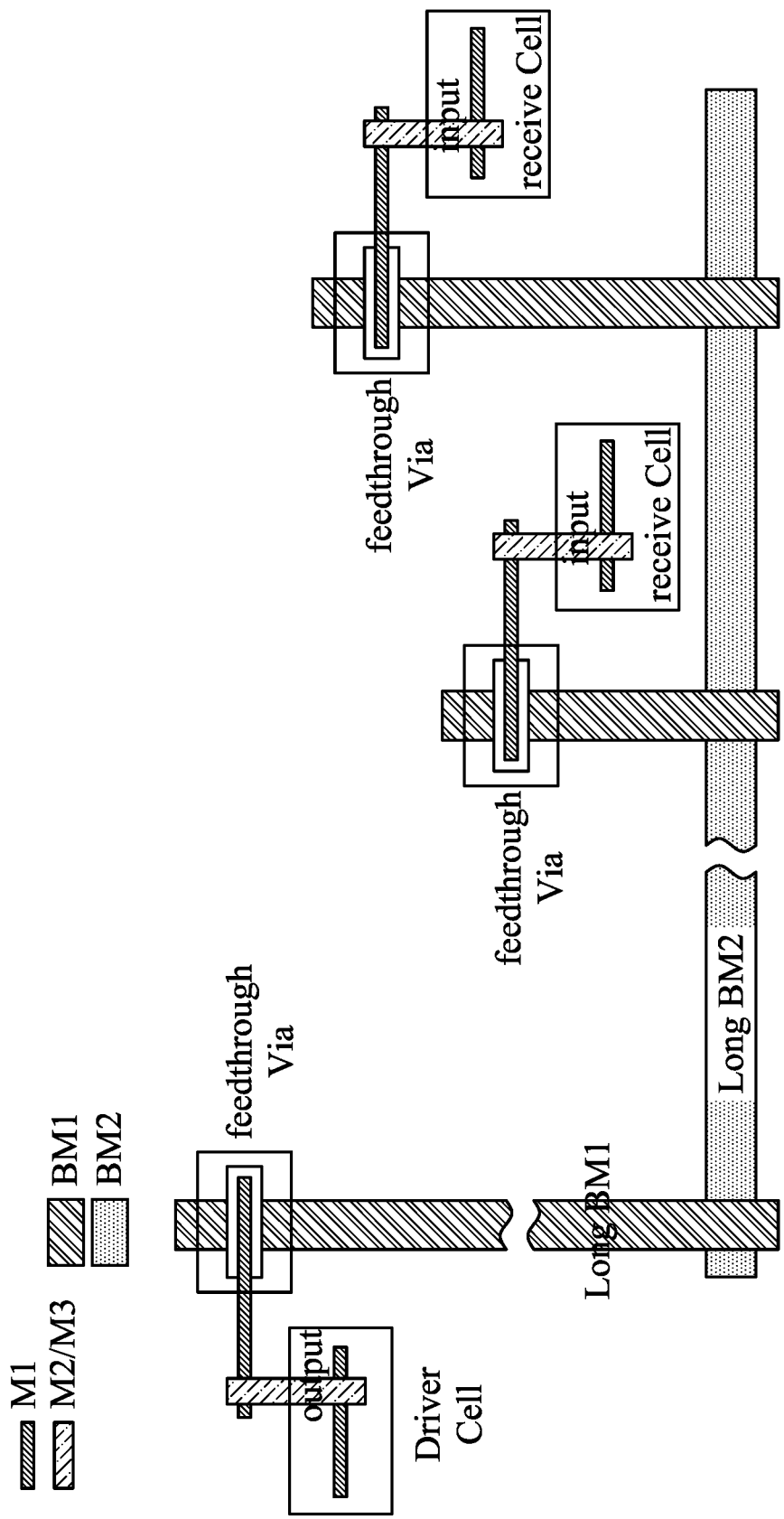

FIG. 1E shows a schematic layout view according to an embodiment of the present disclosure. The signal from a drain of the driver cell (driver FET) is routed to one or more frontside wirings (M1, M2 or M3) and to the backside by an FT via. One or more backside wirings receive the signal from the FT via, and send the signal to the frontside wirings by other FT vias. The signal from the backside is input to gates of the receiver cells (receiver FET).

Figure 2:
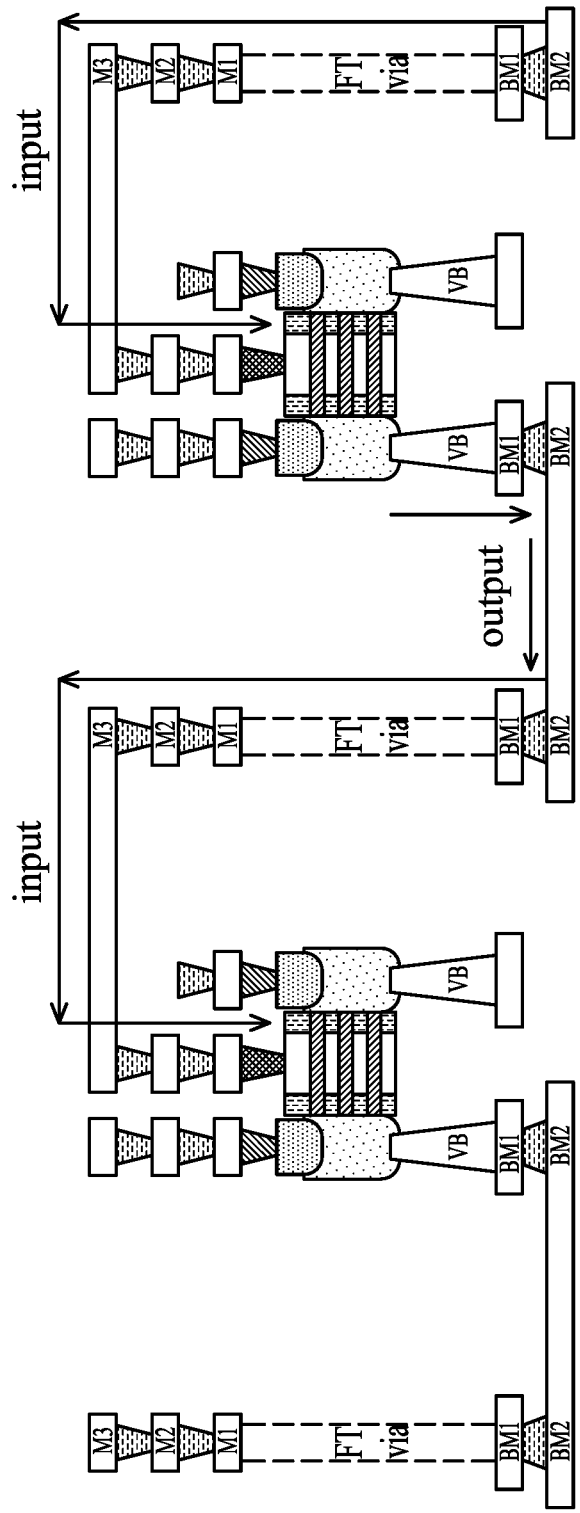
FIGS. 2 and 3 show circuit diagrams of a semiconductor device according to embodiments of the present disclosure.

FIG. 2 shows a schematic circuit diagram of a semiconductor device according to embodiments of the present disclosure. In some embodiments, the input signal, which is output from another FET, is routed through a backside wiring structure including a first backside wiring layer BM1 and a second backside wiring layer BM2 coupled to the first backside wiring layer by a via, a feedthrough via (FT via), and a frontside wiring structure including a first frontside wiring layer Ml, a second front side wiring layer M2 and a third frontside wiring layer M3. In some embodiments, the output signal from one FET is routed by the bottom via VB, the backside wiring layers BM1 and BM2, the feedthrough via and the front wiring layers M1, M2 and M3. In some embodiments, the via VB is coupled to a power supply (Vdd or Vss) through the backside wiring layers BM1.

Figure 3:
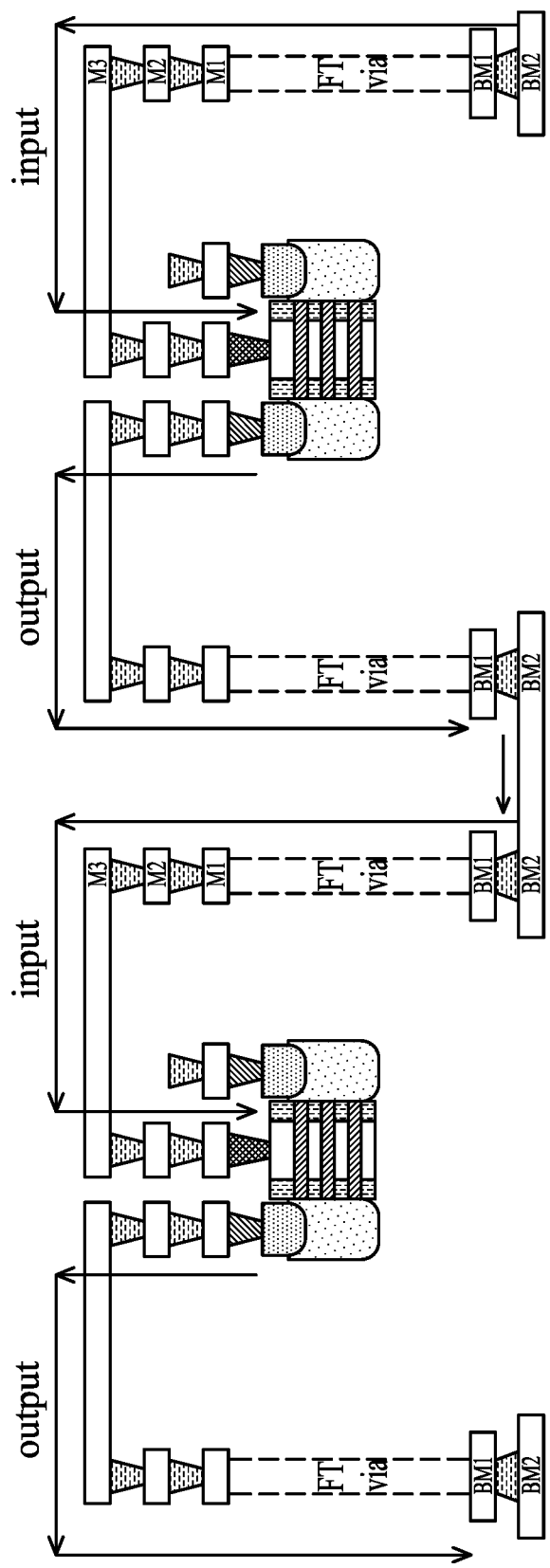

In some embodiments, the source and/or the drain are connected to the first backside wiring layer BM1 through a bottom via VB as shown in FIGS. 1A, 1C and 2. In other embodiments, no bottom via VB is formed to contact the source/drain as shown in FIG. 3.

FIGS. 4-26B show a sequential manufacturing process for a semiconductor FET device according to an embodiment of the present disclosure. It is understood that additional operations can be provided before, during, and after processes shown by FIGS. 4-26B, and some of the operations described below can be replaced or eliminated, for additional embodiments of the method. The order of the operations/processes may be interchangeable.

Figure 4:
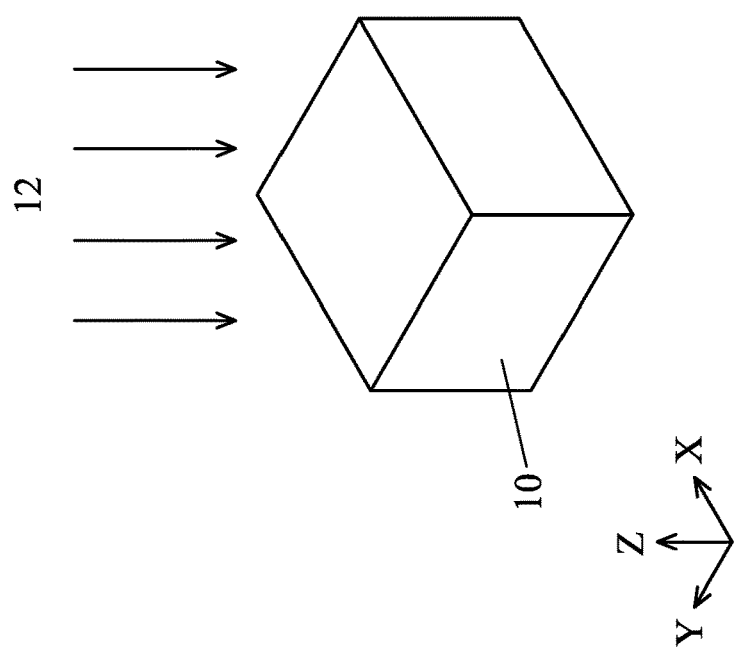

As shown in FIG. 4, impurity ions (dopants) 12 are implanted into a semiconductor substrate (wafer) 10 to form a well region. The ion implantation is performed to prevent a punch-through effect. In some embodiments, the substrate 10 includes a single crystalline semiconductor layer on at least its surface portion. In some embodiments, the substrate 10 is a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si. The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer. The substrate 10 may include various regions that have been suitably doped with impurities (e.g., p-type or n-type conductivity). The dopants 12 are, for example, boron ($BF_2$) for an n-type Fin FET and phosphorus for a p-type Fin FET.

Figure 5:
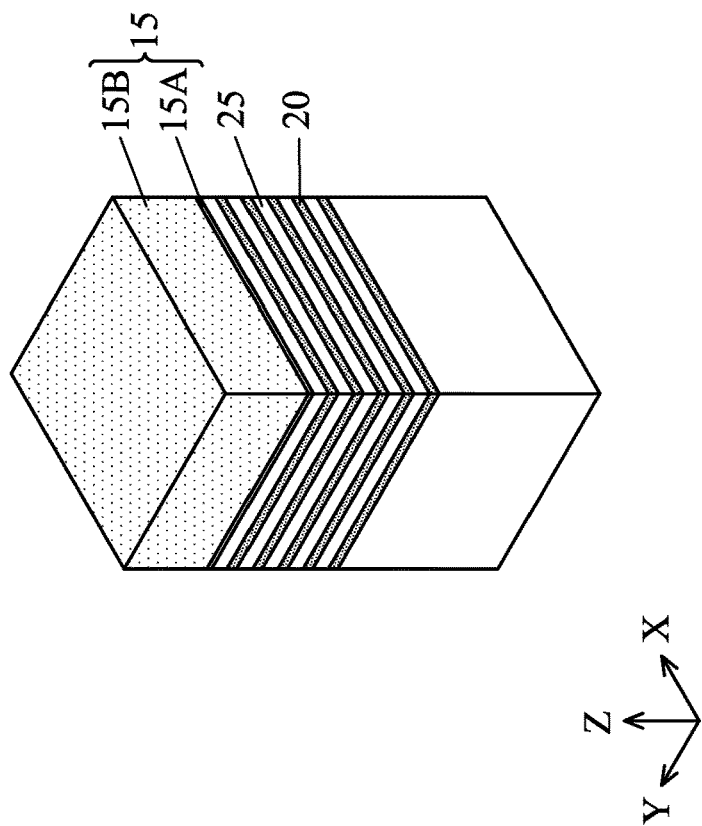

Then, as shown in FIG. 5, stacked semiconductor layers are formed over the substrate 10. The stacked semiconductor layers include first semiconductor layers 20 and second semiconductor layers 25. Further, a mask layer 15 is formed over the stacked layers. The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is more than about 0.3, or Ge (x=1.0) and the second semiconductor layers 25 are Si or $Si_{1-y}Ge_y$, where y is less than about 0.4, and x>y. In this disclosure, an "M" compound" or an "M based compound" means the majority of the compound is M. In another embodiment, the second semiconductor layers 25 are $Si_{1-y}Ge_y$, where y is more than about 0.3, or Ge, and the first semiconductor layers 20 are Si or $Si_{1-x}Ge_x$, where x is less than about 0.4, and x<y. In yet other embodiments, the first semiconductor layer 20 is made of $Si_{1-x}Ge_x$, where x is in a range from about 0.3 to about 0.8, and the second semiconductor layer 25 is made of $Si_{1-x}Ge_x$, where x is in a range from about 0.1 to about 0.4. In FIG. 5, five layers of the first semiconductor layer 20 and six layers of the second semiconductor layer 25 are disposed. However, the number of the layers are not limited to five, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 50 nm in some embodiments, and is in a range from about 10 nm to about 30 nm in other embodiments. The thickness of the second semiconductor layers 25 is in a range from about 5 nm to about 30 nm in some embodiments, and is in a range from about 10 nm to about 20 nm in other embodiments. The thickness of each of the first semiconductor layers 20 may be the same, or may vary. In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, as shown in FIG. 5, the mask layer 15 includes a first mask layer 15A and a second mask layer 15B. The first mask layer 15A is a pad oxide layer made of a silicon oxide, which can be formed by a thermal oxidation. The second mask layer 15B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 15 is patterned into a mask pattern by using patterning operations including photo-lithography and etching.

Figure 6:
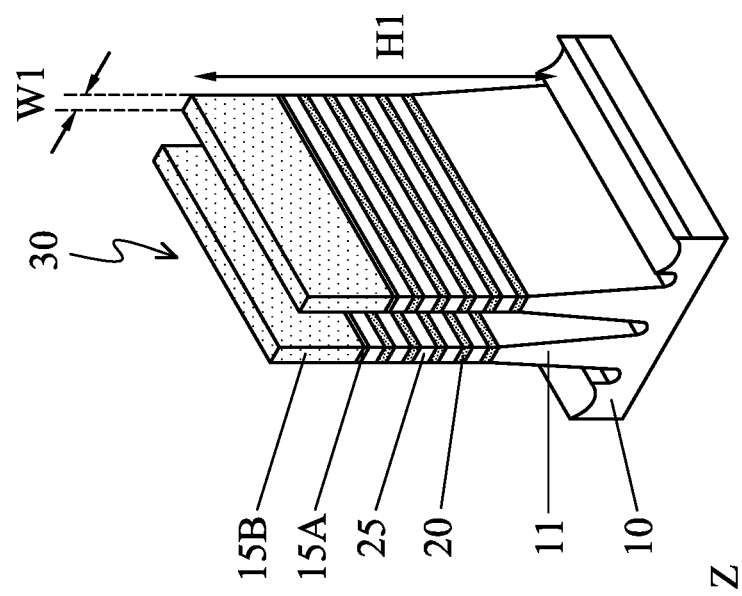

Next, as shown in FIG. 6, the stacked layers of the first and second semiconductor layers 20, 25 are patterned by using the patterned mask layer, thereby the stacked layers are formed into fin structures 30 extending in the X direction. In FIG. 6, two fin structures 30 are arranged in the Y direction. But the number of the fin structures is not limited to, and may be as small as one and three or more. In some embodiments, one or more dummy fin structures are formed on both sides of the fin structures 30 to improve pattern fidelity in the patterning operations.

The fin structures 30 can be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned into mandrels using a photolithography process. Spacers are formed alongside the mandrels using a self-aligned process. The mandrels are then removed, and the remaining spacers may then be used to pattern the fin structures. The multi-patterning processes combining photolithography and self-aligned processes generally result in forming a pair of fin structures.

As shown in FIG. 6, the fin structures 30 have upper portions constituted by the stacked semiconductor layers 20, 25 and well portions 11. The width W1 of the upper portion of the fin structure along the Y direction is in a range from about 5 nm to about 50 nm in some embodiments, and is in a range from about 10 nm to about 30 nm in other embodiments. The height H1 along the Z direction of the fin structure is in a range from about 100 nm to about 200 nm in some embodiments.

After the fin structure is formed, an insulating material layer 41 including one or more layers of insulating material is formed over the substrate so that the fin structures are fully embedded in the insulating layer 41. The insulating material for the insulating layer 41 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating layer 41. Then, a planarization operation, such as a chemical mechanical polishing (CMP) method and/or an etch-back method, is performed such that the upper surface of the uppermost second semiconductor layer 25 is exposed from the insulating material layer 41 as shown in FIG. 7.

Figure 7:
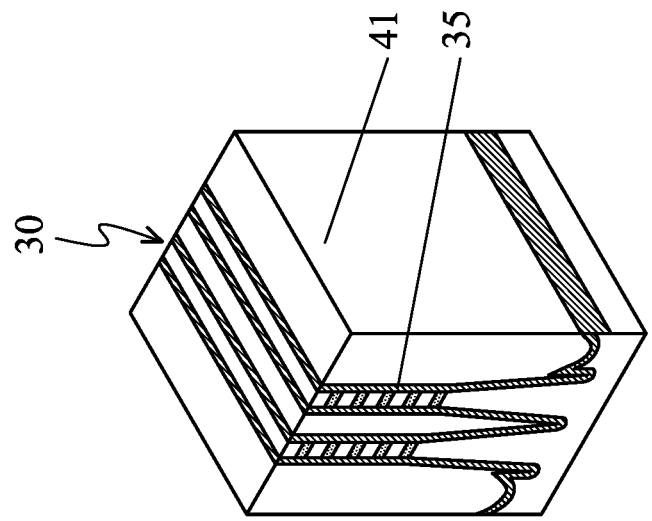

In some embodiments, a first liner layer 35 is formed over the structure of FIG. 6 before forming the insulating material layer 41, as shown FIG. 7. The first liner layer 35 is made of SiN or a silicon nitride-based material (e.g., SiON, SiCN or SiOCN).

Then, as shown in FIG. 8, the insulating material layer 41 is recessed to form an isolation insulating layer 40 so that the upper portions of the fin structures 30 are exposed. With this operation, the fin structures 30 are electrically separated from each other by the isolation insulating layer 40, which is also called a shallow trench isolation (STI).

In the embodiment shown in FIG. 8, the insulating material layer 41 is recessed until the bottommost first semiconductor layer 20 is exposed. In other embodiments, the upper portion of the well layer 11 is also partially exposed. The first semiconductor layers 20 are sacrificial layers which are subsequently partially removed, and the second semiconductor layers 25 are subsequently formed into channel layers of a GAA FET.

After the isolation insulating layer 40 is formed, a sacrificial gate dielectric layer 52 is formed, as shown in FIG. 9. The sacrificial gate dielectric layer 52 includes one or more layers of insulating material, such as a silicon oxide-based material. In one embodiment, silicon oxide formed by CVD is used. The thickness of the sacrificial gate dielectric layer 52 is in a range from about 1 nm to about 5 nm in some embodiments.

FIG. 10 illustrates a structure after a sacrificial gate structure 50 is formed over the exposed fin structures 30. The sacrificial gate structure includes a sacrificial gate electrode 54 and the sacrificial gate dielectric layer 52. The sacrificial gate structure 50 is formed over a portion of the fin structure which is to be a channel region. The sacrificial gate structure defines the channel region of the GAA FET.

The sacrificial gate structure 50 is formed by first blanket depositing the sacrificial gate dielectric layer 52 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 56 and a silicon oxide mask layer 58.

Next, a patterning operation is performed on the mask layer and sacrificial gate electrode layer is patterned into the sacrificial gate structure 50, as shown in FIG. 10. The sacrificial gate structure includes the sacrificial gate dielectric layer 52, the sacrificial gate electrode layer 54 (e.g., poly silicon), the pad SiN layer 56 and the silicon oxide mask layer 58. By patterning the sacrificial gate structure, the stacked layers of the first and second semiconductor layers are partially exposed on opposite sides of the sacrificial gate structure, thereby defining source/drain (S/D) regions, as shown in FIG. 10. In this disclosure, a source (region) and a drain (region) are interchangeably used, and the structures thereof are substantially the same. In FIG. 10, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

After the sacrificial gate structure is formed, a blanket layer 53 of an insulating material for sidewall spacers 55 is conformally formed by using CVD or other suitable methods, as shown in FIG. 11. The blanket layer 53 is deposited in a conformal manner so that it has substantially equal thicknesses on vertical surfaces, such as the sidewalls, horizontal surfaces, and the top of the sacrificial gate structure. In some embodiments, the blanket layer 53 is deposited to a thickness in a range from about 2 nm to about 10 nm. In one embodiment, the insulating material of the blanket layer 53 is a silicon nitride-based material, such as SiN, SiON, SiOCN or SiCN and combinations thereof.

Figure 12B:
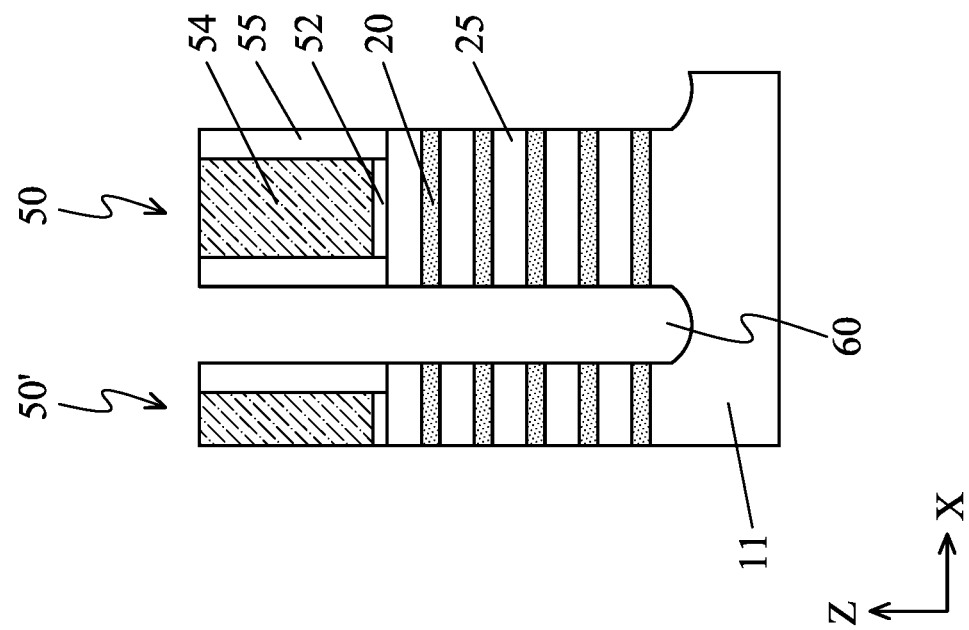
FIGS. 12A and 12B show schematic views of one of the various stages of a sequential manufacturing operation of a semiconductor device according to an embodiment of the present disclosure.
Figure 12A:
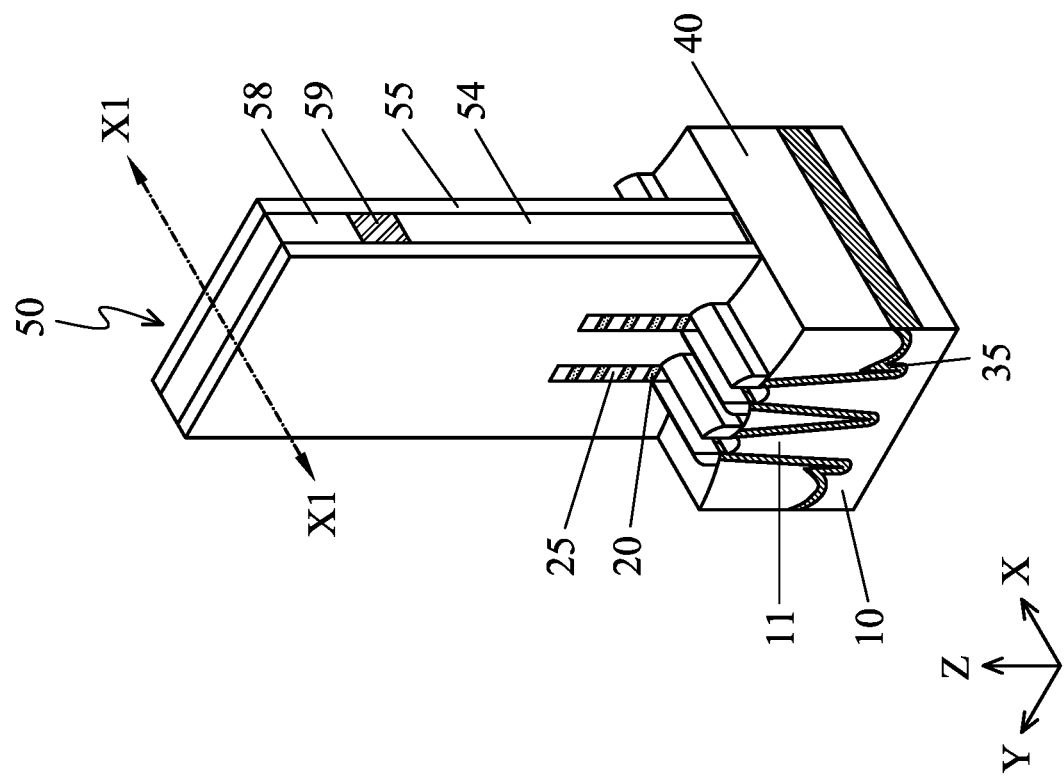

Further, as shown in FIGS. 12A and 12B, sidewall spacers 55 are formed on opposite sidewalls of the sacrificial gate structures, and subsequently, the fin structures of the S/D regions are recessed down below the upper surface of the isolation insulating layer 40. FIG. 12B is the cross sectional view corresponding to line X1-X1 of FIG. 12A. In FIG. 12B, the cross section of the bottom parts of one sacrificial gate structure 50 and an adjacent sacrificial gate structure 50' are illustrated.

After the blanket layer 53 is formed, anisotropic etching is performed on the blanket layer 53 using, for example, reactive ion etching (ME). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. The mask layer 58 may be exposed from the sidewall spacers. In some embodiments, isotropic etching may be subsequently performed to remove the insulating material from the upper portions of the S/D region of the exposed fin structures 30.

Subsequently, the fin structures of the S/D regions are recessed down below the upper surface of the isolation insulating layer 40, by using dry etching and/or wet etching. As shown in FIG. 12A, the sidewall spacers 55 formed on the S/D regions of the exposed fin structures partially remain. In other embodiments, however, the sidewall spacers 55 formed on the S/D regions of the exposed fin structures are fully removed. At this stage, end portions of the stacked layer of the first and second semiconductor layers 20, 25 under the sacrificial gate structure have substantially flat faces which are flush with the sidewall spacers 55, as shown in FIG. 12B. In some embodiments, the end portions of the stacked layer of the first and second semiconductor layers 20, 25 are slightly horizontally etched.

Figure 13B:
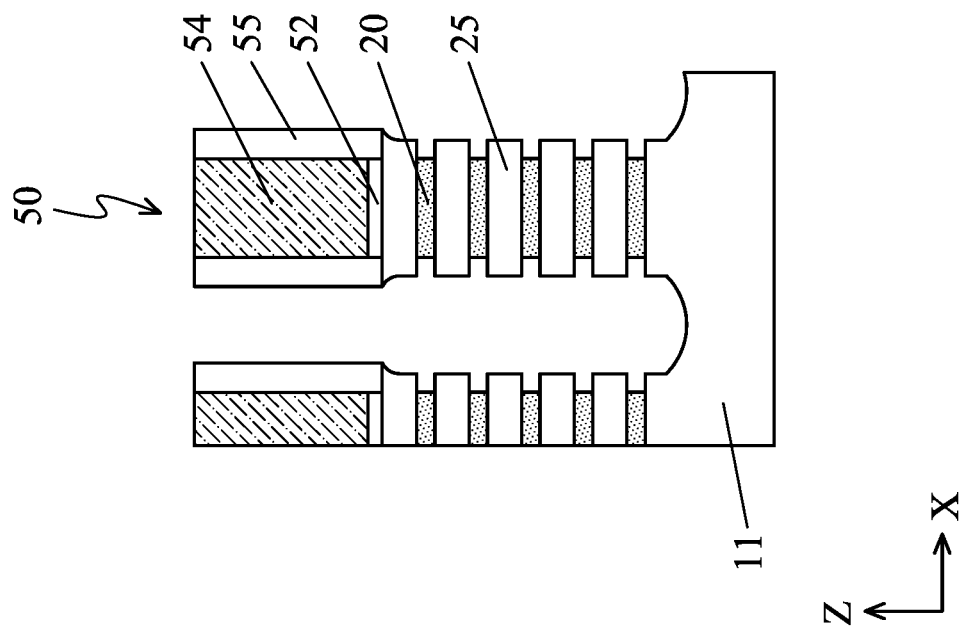
FIGS. 13A and 13B show schematic views of one of the various stages of a sequential manufacturing operation of a semiconductor device according to an embodiment of the present disclosure.
Figure 13A:
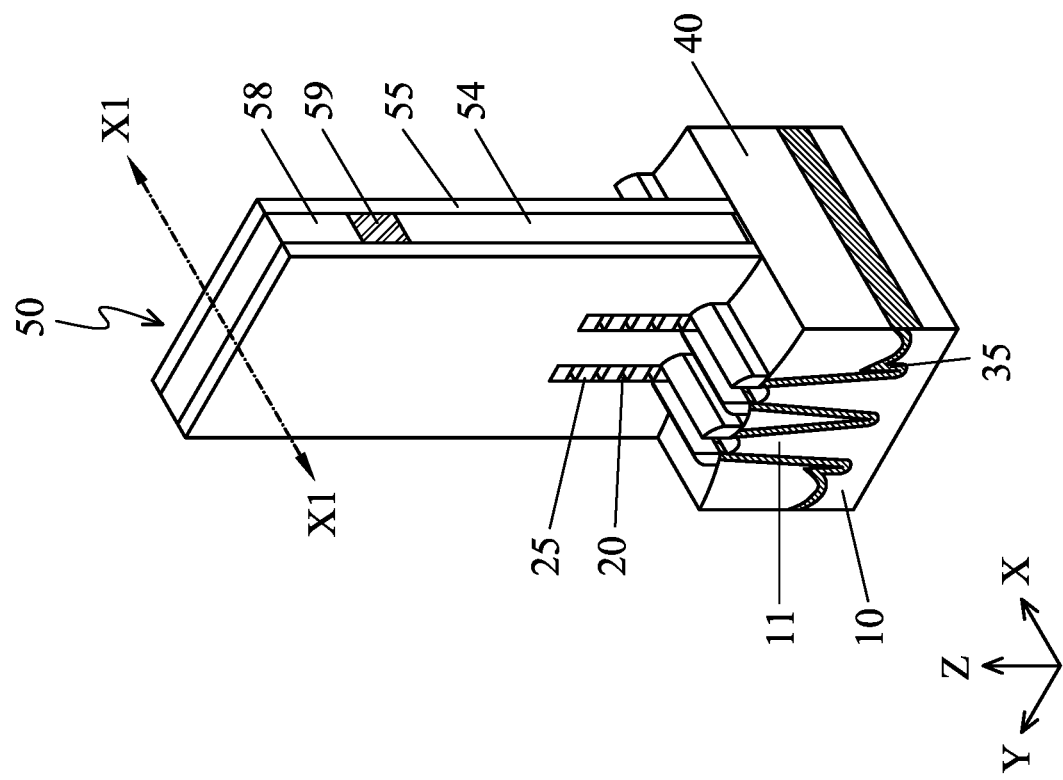

Subsequently, as shown in FIGS. 13A and 13B, the first semiconductor layers 20 are horizontally recessed (etched) so that edges of the first semiconductor layers 20 are located substantially below a side face of the sacrificial gate electrode layer 54. In some embodiments, as shown in FIG. 13B, end portions (edges) of the first semiconductor layers 20 under the sacrificial gate structure are substantially aligned with the side faces of the sacrificial gate electrode layer 54. Here, "being substantially aligned" means the difference in the relative position is less than about 1 nm. In some embodiments, the ends of the first semiconductor layers 20 are curved convex toward inside of the first semiconductor layers 20. In some embodiments, during the recess etching of the first semiconductor layers 20 and/or the recess etching of the first and second semiconductor layers, end portions of the second semiconductor layers 25 are also horizontally etched. The recessed amount of the first semiconductor layers 20 is greater than the recessed amount of the second semiconductor layers 25.

Figure 14:
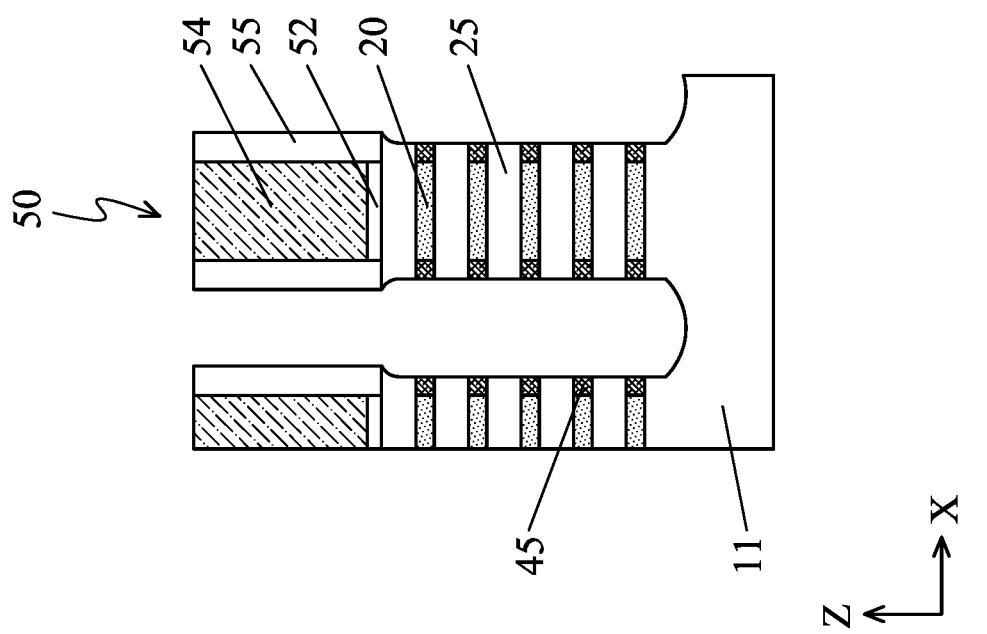
FIG. 14 shows a schematic view of one of the various stages of a sequential manufacturing operation of a semiconductor device according to an embodiment of the present disclosure.
Figure 15B:
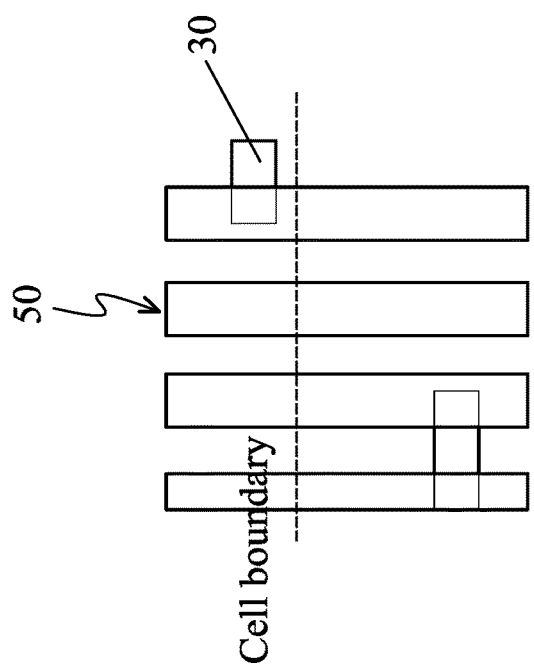
FIGS. 15A and 15B show schematic views of one of the various stages of a sequential manufacturing operation of a semiconductor device according to an embodiment of the present disclosure.
Figure 15A:
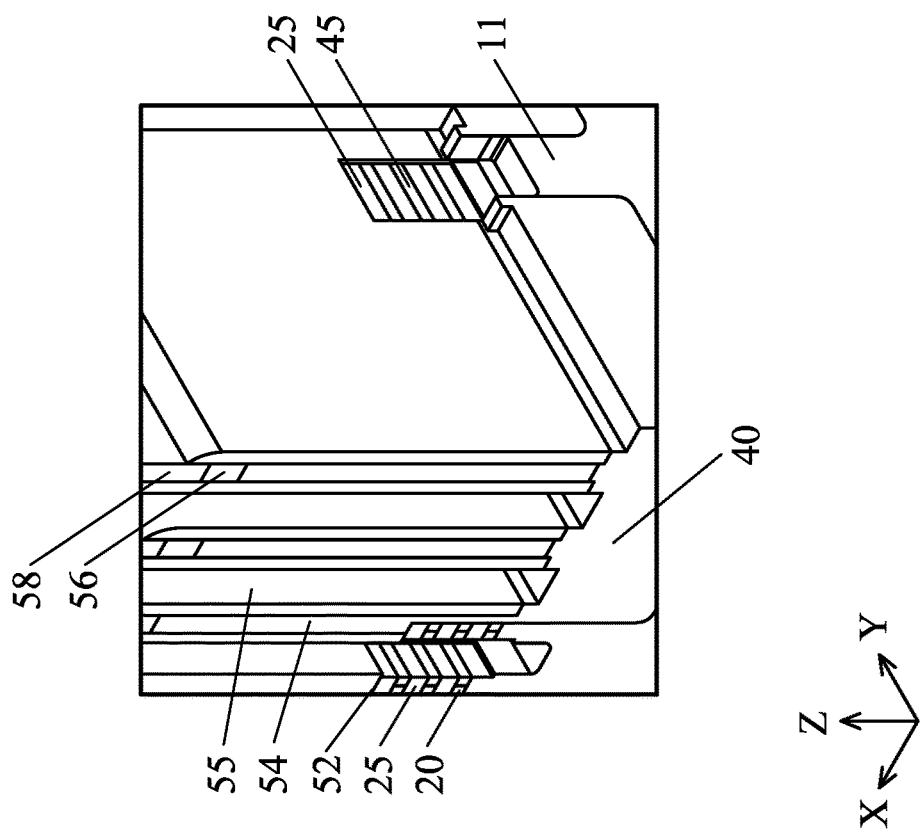

After the first semiconductor layers 20 are horizontally recessed, one or more dielectric layers are conformally formed on the end surfaces of the first and second semiconductor layers 20, 25, on the fin structure 11 and over the sacrificial gate structures 50. Then, anisotropic etching is performed to form inner spacers 45 on the end faces of the first semiconductor layers 20 as shown in FIG. 14. The inner spacers 45 are made of one or more of silicon nitride and silicon oxide, SiON, SiOC, SiCN or SiOCN, or any other suitable dielectric material. FIGS. 15A and 15B are a perspective view and a plan view, respectively, corresponding to the process stage of FIG. 14. The cell boundary of FIG. 15B indicates a boundary between adjacent standard cells.

Figure 16A:
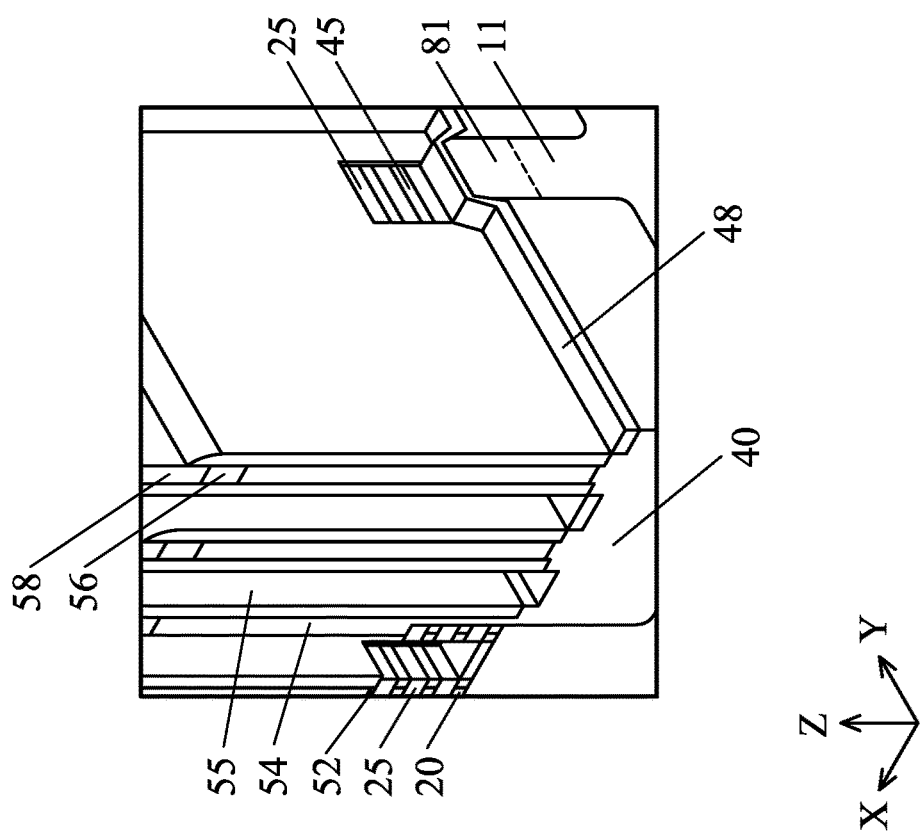
FIGS. 16A and 16B show schematic views of one of the various stages of a sequential manufacturing operation of a semiconductor device according to an embodiment of the present disclosure.
Figure 16B:
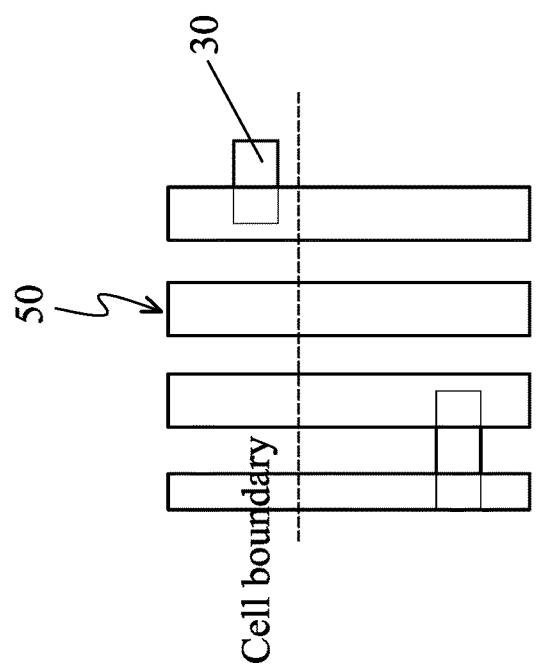

After the inner spacers 45 are formed, a first epitaxial layer 81 is formed over the recessed fin structure 11, and then a dielectric layer 48 is formed over the first epitaxial layer 81 and the isolation insulating layer 40, as shown in FIG. 16A. FIG. 16B is a schematic layout (plan or top) view of FIG. 16A.

In some embodiments, the first epitaxial layer 81 is a non-doped epitaxial semiconductor layer, such as Si or SiGe. In some embodiments, the dielectric layer 48 includes one or more of silicon nitride and silicon oxide, SiON, SiOC, SiCN and SiOCN, or any other suitable dielectric material, which is the same as or different from the dielectric material of the isolation insulating layer 40, sidewall spacer 55 and/or the inner spacers 45.

Figure 17B:
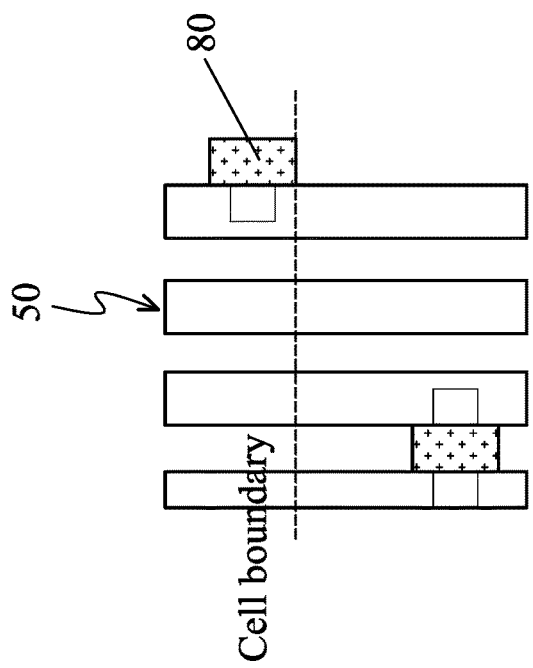
FIGS. 17A and 17B show schematic views of one of the various stages of a sequential manufacturing operation of a semiconductor device according to an embodiment of the present disclosure.
Figure 17A:
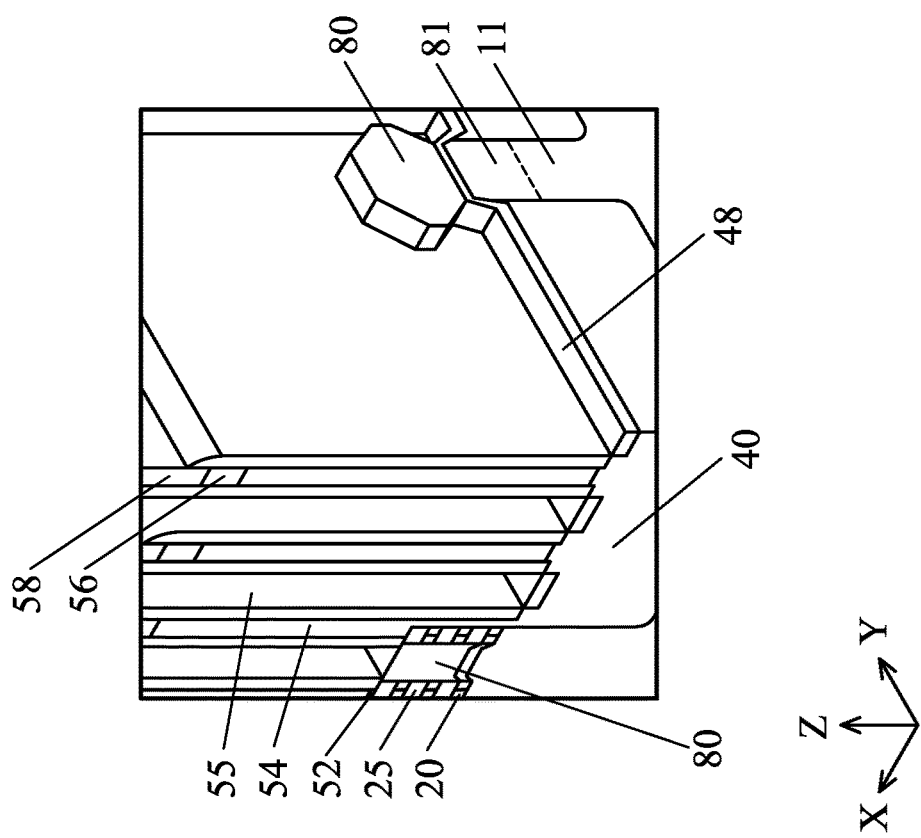

Next, as shown in FIGS. 17A and 17B, a second epitaxial layer (source/drain epitaxial layer) 80 is formed on the end faces of the second semiconductor layers 25. The source/drain epitaxial layer includes one or more layers of SiP, SiAs, SiCP, SiPAs and/or SiC for an n-type FET, and SiGe, GeSn and/or SiGeSn for a p-type FET. For the p-type FET, the source/drain epitaxial layer is doped with B (boron) in some embodiments. In some embodiments, the source/drain epitaxial layer includes multiple layers. The source/drain epitaxial layers are formed by an epitaxial growth method using CVD, ALD or molecular beam epitaxy (MBE).

In some embodiments, the source/drain epitaxial layer of an n-type FET includes a first epitaxial layer grown from the end faces of the second semiconductor layer 25, a second epitaxial layer formed on the first epitaxial layer and a third epitaxial layer formed on the second epitaxial layer. In some embodiments, the first epitaxial layer is made of SiP, SiAs or SiAs:P or a combination thereof. In some embodiments, the P concentration of the first epitaxial layer is in a range from about $0.5\times10^{19}$ atoms/cm$^3$ to about $5\times10^{20}$ atoms/cm$^3$, and is in a range from about $0.8\times10^{19}$ atoms/cm$^3$ to about $2\times10^{20}$ atoms/cm$^3$ in other embodiments. In some embodiments, the second epitaxial layer is made of SiP. In some embodiments, the P concentration of the second epitaxial layer is higher than that of the first SiP epitaxial layer, and is in a range from about $1\times10^{21}$ atoms/cm$^3$ to about $5\times10^{21}$ atoms/cm$^3$, and is in a range from about $2\times10^{21}$ atoms/cm$^3$ to about $4\times10^{21}$ atoms/cm$^3$ in other embodiments. In some embodiments, the third epitaxial layer is made of SiGeP. In some embodiments, the P concentration of the third epitaxial layer is equal to or lower than that of the second SiP epitaxial layer and higher than that of the first SiP epitaxial layer, and is in a range from about $0.5\times10^{21}$ atoms/cm$^3$ to about $4\times10^{21}$ atoms/cm$^3$, and is in a range from about $1\times10^{21}$ atoms/cm$^3$ to about $3\times10^{21}$ atoms/cm$^3$ in other embodiments. In some embodiments, the Ge concentration of the third epitaxial layer is in a range from about 0.5 atomic % to 10 atomic %, and is in a range from about 1 atomic % to about 5 atomic % in other embodiments.

In some embodiments, the source/drain epitaxial layer of a p-type FET includes a first epitaxial layer, a second epitaxial layer and a third epitaxial layer, similar to the n-type FET as above. In some embodiments, the first epitaxial layer is made of SiGe doped with B. In some embodiments, the Ge content is in a range from about 15 atomic % to about 30 atomic %. In some embodiments, the B concentration of the first epitaxial layer is in a range from about $1\times10^{19}$ atoms/cm$^3$ to about $1\times10^{21}$ atoms/cm$^3$, and is in a range from about $5\times10^{19}$ atoms/cm$^3$ to about $5\times10^{20}$ atoms/cm$^3$ in other embodiments. In some embodiments, the second epitaxial layer is made of SiGe doped with B. In some embodiments, the Ge content of the second epitaxial layer is in a range from about 20 atomic % to about 35 atomic % in some embodiments. In some embodiments, the B concentration of the second epitaxial layer is equal to or higher than the largest B concentration of the first epitaxial layer, and is in a range from about $0.5\times10^{20}$ atoms/cm$^3$ to about $1\times10^{21}$ atoms/cm$^3$, and is in a range from about $1\times10^{20}$ atoms/cm$^3$ to about $5\times10^{20}$ atoms/cm$^3$ in other embodiments. In some embodiments, the third epitaxial layer is made of SiGe doped with B. In some embodiments, the Ge content is in a range from 25 atomic % to about 60 atomic %. In some embodiments, the average Ge content of the third epitaxial layer is greater than the Ge content of the second epitaxial layer. In some embodiments, the B concentration of the third epitaxial layer is in a range from about $5\times10^{19}$ atoms/cm$^3$ to about $5\times10^{21}$ atoms/cm$^3$, and is in a range from about $1\times10^{20}$ atoms/cm$^3$ to about $3\times10^{21}$ atoms/cm$^3$ in other embodiments.

As shown in FIG. 17A, the source/drain epitaxial layer 80 is in contact with the dielectric layer 48 and the inner spacers 45.

Figure 18A:
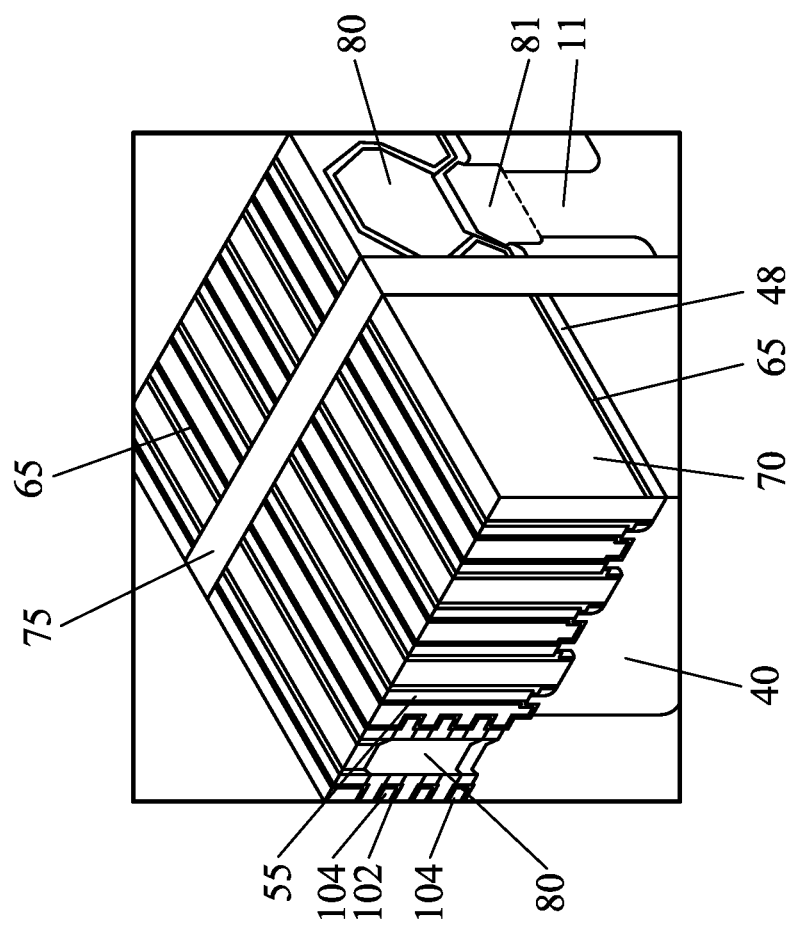
FIGS. 18A and 18B show schematic views of one of the various stages of a sequential manufacturing operation of a semiconductor device according to an embodiment of the present disclosure.
Figure 18B:
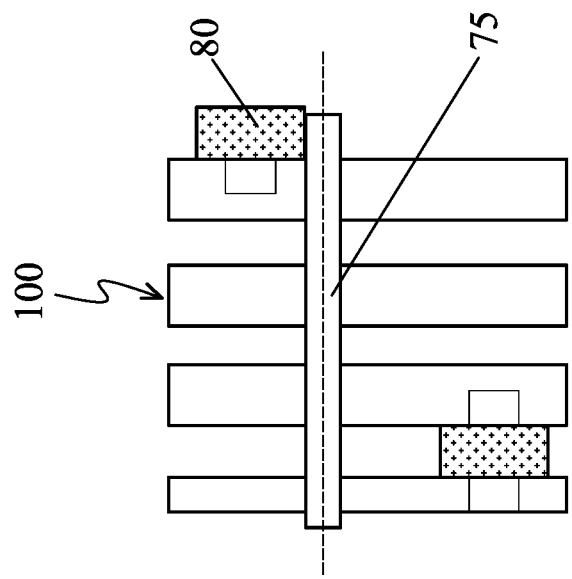

Further, as shown in FIGS. 18A and 18B, a first etch stop layer (ESL) 65 is formed over the sacrificial gate structure 50 and the S/D epitaxial layer 80. The first ESL 65 is made of silicon nitride, SiON or any other suitable dielectric material and has a thickness in a range from about 1 nm to about 20 nm in some embodiments. Further, a first interlayer dielectric (ILD) layer 70 is formed over the ESL 65. In some embodiments, the first ILD layer 70 is made of silicon oxide, SiON, SiOCN, SiOC, SiCN or any other suitable dielectric material, different from the first ESL 65. After the first ILD layer 70 is formed, one or more planarization operations, such as chemical mechanical polishing (CMP), are performed to expose the sacrificial gate electrode 54.

Then, the sacrificial gate electrode 54 and sacrificial gate dielectric layer 52 are removed. The first ILD layer 70 protects the source/drain epitaxial layer 80 during the removal of the sacrificial gate structures. The sacrificial gate structures can be removed using plasma dry etching and/or wet etching. When the sacrificial gate electrode 54 is polysilicon, a wet etchant such as a TMAH solution can be used to selectively remove the sacrificial gate electrode 54. The sacrificial gate dielectric layer 52 is thereafter removed using plasma dry etching and/or wet etching.

After the sacrificial gate structures are removed, the first semiconductor layers 20 are removed, thereby forming wires or sheets (channel regions) of the second semiconductor layers 25. The first semiconductor layers 20 can be removed or etched using an etchant that can selectively etch the first semiconductor layers 20 against the second semiconductor layers 25. Since the inner spacers 45 are formed, the etching of the first semiconductor layers 20 stops at the inner spacers 45.

After the semiconductor wires or sheets (channel regions) of the second semiconductor layers 25 are released, a gate dielectric layer 102 is formed around each channel regions, and further, a gate electrode layer 104 is formed on the gate dielectric layer 102, as shown in FIG. 18A. In some embodiments, the structure and/or material of the gate electrode for the n-type GAA FET are different from the structure and/or material of the gate electrode for the p-type GAA FET.

In certain embodiments, the gate dielectric layer 102 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 102 includes an interfacial layer (not shown) formed between the channel layers and the dielectric material. The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness around each channel layers. The thickness of the gate dielectric layer 102 is in a range from about 1 nm to about 6 nm in one embodiment.

The gate electrode layer 104 is formed on the gate dielectric layer 102 to surround each channel layer. The gate electrode 104 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 104 may be formed by CVD, ALD, electro-plating, or other suitable method. The gate dielectric layer and the gate electrode layer are then planarized by using, for example, CMP, until the top surface of the first ILD layer 70 is revealed. In some embodiments, after the planarization operation, the gate electrode layer 104 is recessed and a cap insulating layer (not shown) is formed over the recessed gate electrode 104. The cap insulating layer includes one or more layers of a silicon nitride-based material, such as silicon nitride. The cap insulating layer can be formed by depositing an insulating material followed by a planarization operation.

In certain embodiments of the present disclosure, one or more work function adjustment layers (not shown) are interposed between the gate dielectric layer 102 and the gate electrode 104. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

In some embodiments, the sacrificial gate structures 50 that are not disposed over the fin structures 30 are also replaced with a metal gate structure 100 as shown in FIGS. 18A and 18B.

Further, as shown in FIGS. 18A and 18B, the metal gate structures 100 are cut by a groove or trench and the groove or the trench is filled with a dielectric material, thereby forming a gate separation wall 75. In some embodiments, the groove or trench penetrate into the substrate 10 passing through the isolation insulating layer 40. In some embodiments, the gate separation wall 75 is made of silicon nitride or any other suitable dielectric material.

Figure 19B:
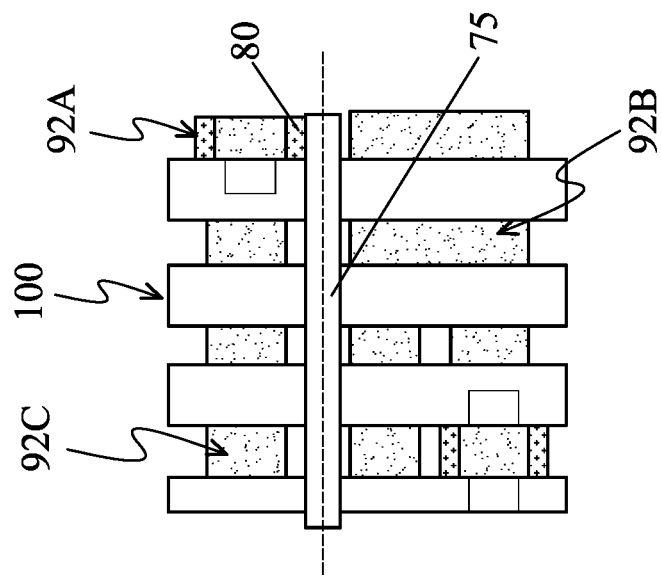
FIGS. 19A and 19B show schematic views of one of the various stages of a sequential manufacturing operation of a semiconductor device according to an embodiment of the present disclosure.
Figure 19A:
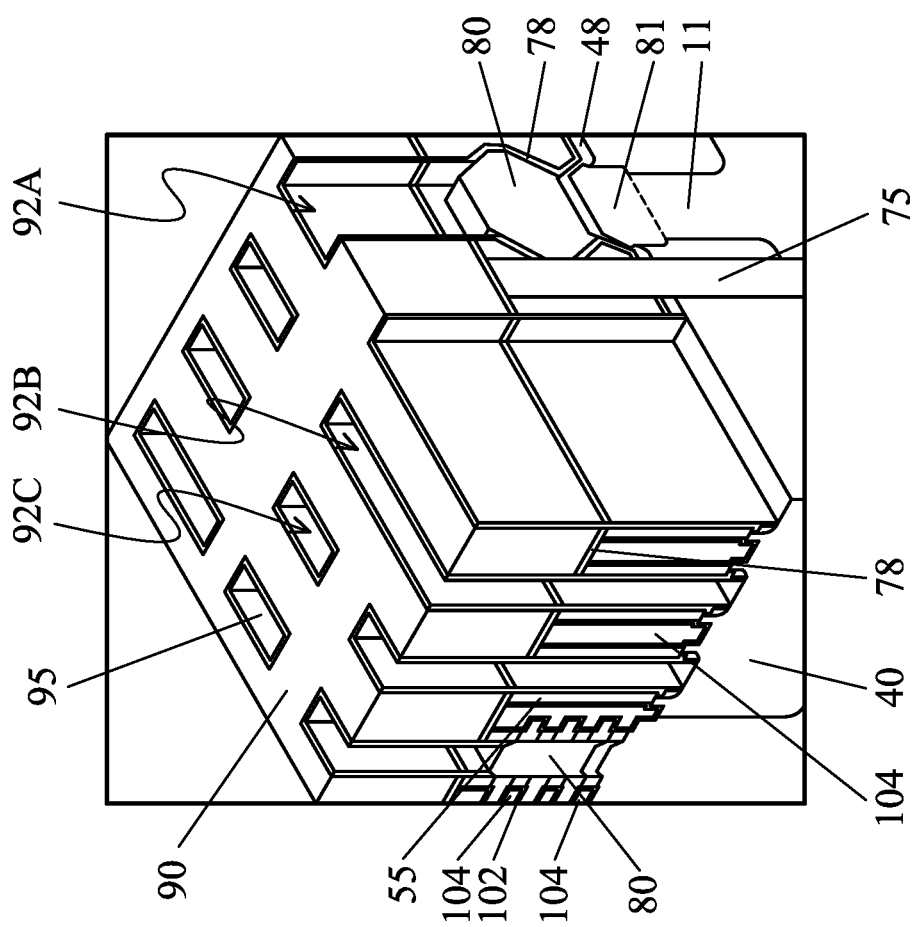

Next, as shown in FIGS. 19A and 19B, a second ESL 78 is formed over the metal gate structures 100 and then a second ILD layer 90 is formed over the second ESL 78. In some embodiments, the second ESL 78 is made of silicon nitride, SiON or any other suitable dielectric material and has a thickness in a range from about 1 nm to about 20 nm. In some embodiments, the second ILD layer 90 is made of silicon oxide, SiON, SiOCN, SiOC, SiCN or any other suitable dielectric material.

Further, first openings 92A for a source/drain contact and second openings 92B for a feedthrough contact are formed in the second ILD layer 90 and the first ILD layer 70. In some embodiments, one or more third openings 92C are formed as dummy patterns to improve process uniformity. At the bottom of the first opening 92A, the source/drain epitaxial layer 80 is exposed, and at the bottom of the second and third openings 92B, 92C, the isolation insulating layer 40 is exposed.

Then, as shown in FIG. 19A, a dielectric liner layer 95 is formed on the inner sidewall of the first and second openings by deposition and anisotropic etching operations. In some embodiments, the dielectric liner layer 95 is made of silicon nitride, SiCN or any other suitable material. In some embodiments, the thickness of the dielectric liner layer 95 is in a range from about 1.5 nm to about 5 nm, depending on design and/or process requirements.

Figure 20B:
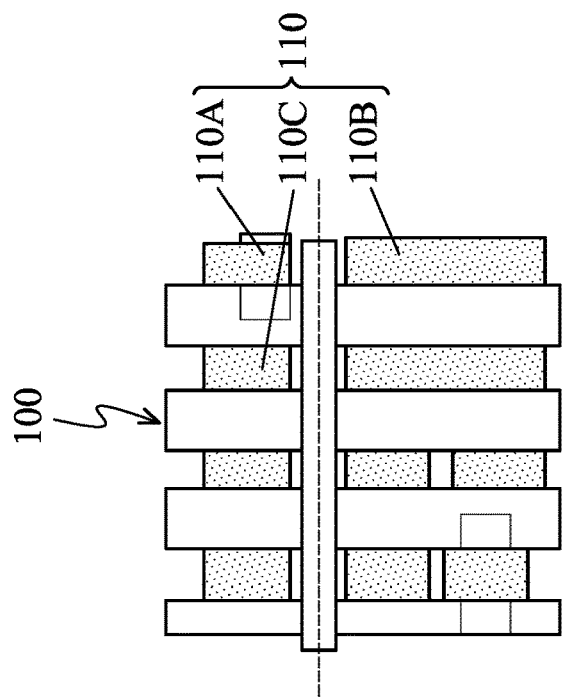
FIGS. 20A and 20B show schematic views of one of the various stages of a sequential manufacturing operation of a semiconductor device according to an embodiment of the present disclosure.
Figure 20A:
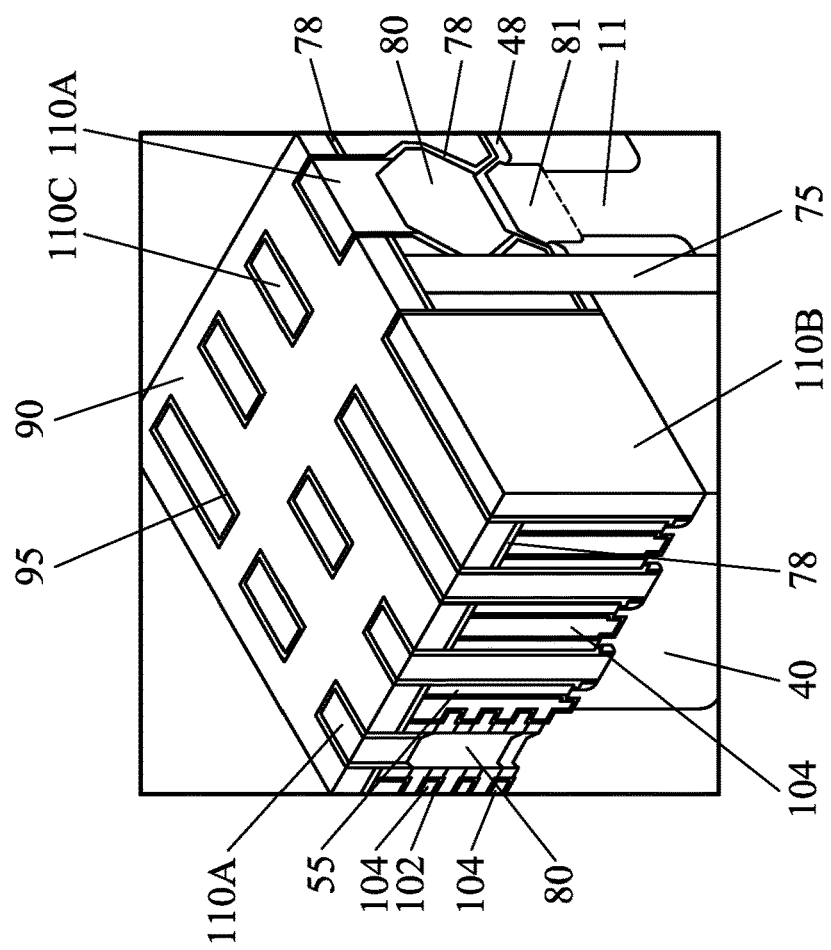

Next, one or more conductive material layers are formed in the first, second and third openings and over the second ILD layer 90, and then one or more planarization operations are performed to expose the upper surface of the second ILD layer 90, thereby forming a source/drain contact 110A contacting the source/drain epitaxial layer 80, a feedthrough contact 110B and a dummy contact 110C (collectively front contacts 110), as shown in FIGS. 20A and 20B. In some embodiments, the front contact 110 is made of one or more layers of Co, Ru, Cu, W, Ni, Mo, Al, Ti or Ta or an alloy thereof. In some embodiments, before the source/drain contact 110A is formed, a silicide layer (e.g., TiSi, NiSi or CoSi)

is formed on the source/drain epitaxial layer 80. As shown in FIGS. 20A and 20B, the feedthrough contact 110B is disposed between two metal gate structure (dummy gate structures). In some embodiments, the front contact 110 includes a barrier layer made of TiN and/or TaN having a thickness in a range from about 1.1 nm to about 5 nm and a body layer made of Co, Ru, Cu, W, Ni, Mo and/or Al. In some embodiments, no barrier layer is formed, and the body layer is a single metal layer.

Subsequently, one or more front wiring layers are formed over the second ILD layer 90 and the front contacts 110, as shown in FIG. 21A. In some embodiments, a first metal wiring layer M1 includes a via 151 connected to the metal gate electrode 104, a via 154 connected to the source/drain contact 110A and a via 157 connected to the feedthrough contact 110B. The first wiring layer M1 also includes pads or lateral wiring pattens formed over the vias. In some embodiments, a second metal wiring layer M2 includes a via 152 connected to the via 151, a via 155 connected to the via 154 and a via 158 connected to the via 157, and also includes pads or lateral wiring pattens formed over the vias. In some embodiments, a third metal wiring layer M3 includes a via 153 connected to the via 152, a via 156 connected to the via 155 and a via 159 connected to the via 158, and also includes pads or lateral wiring pattens formed over the vias. In some embodiments, one or more additional wiring layers Mn that includes vias and lateral wiring patterns are formed over the third wiring layer M3. In some embodiments, the total number of wiring layers is more than 7 and up to 20. At this stage, the feedthrough contact 110B and the dummy contact 110C are fully surrounded by dielectric layers, respectively.

Further, a carrier substrate 150D is attached over the wiring layers or one or more layers formed over the wiring layers, and the substrate is flipped as shown in FIGS. 21B. The currier substrate is a Si wafer or a dielectric layer. In FIG. 21B and thereafter, the wiring layers and the carrier substrate are referred as a front layer 150. After the substrate is flipped over, the backside of the substate 10 is etched to expose the bottom of the isolation insulating layer 40, as shown in FIG. 21B.

Next, a hard mask layer 200 is formed over the etched backside of the substrate as shown in FIG. 21C. In some embodiments, the hard mask layer 200 is made of at least one of SiC, LaO, AlO, AlON, ZrO, HfO, SiN, ZnO, ZrN, ZrAlO, TiO, TaO, YO, TaCN, ZrSi, SiOCN, SiOC, SiCN, or SiO or any other suitable material. In some embodiments, the thickness of the hard mask layer 200 is in a range from about 10 nm about 100 nm.

Figure 22B:
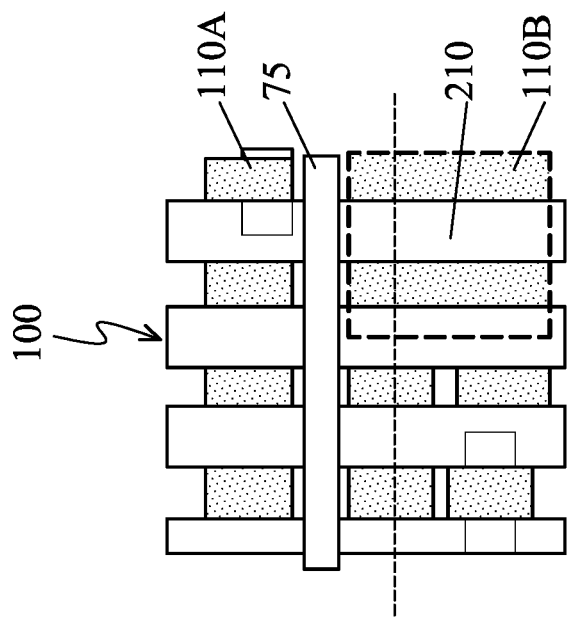
FIGS. 22A and 22B show schematic views of one of the various stages of a sequential manufacturing operation of a semiconductor device according to an embodiment of the present disclosure.
Figure 22A:
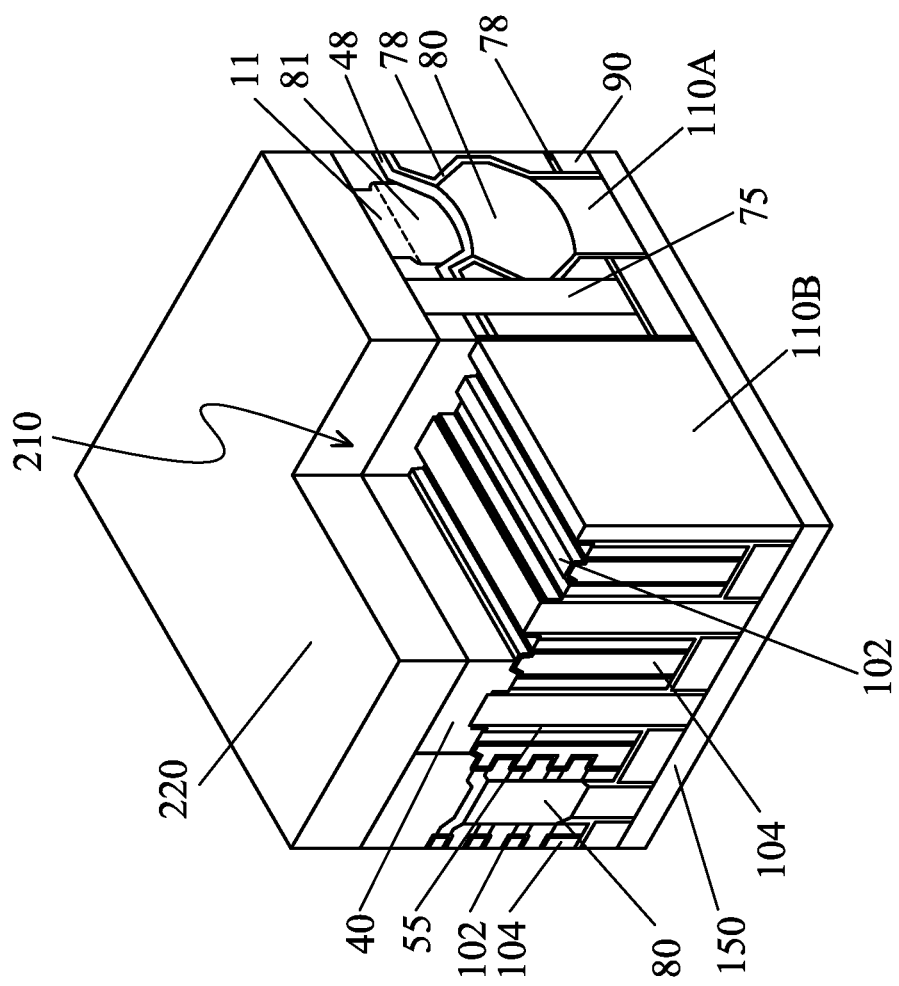

Then, by using one or more lithography and etching operations, the hard mask layer 200 is patterned to form an opening 210, and then the isolation insulating layer 40 below the feedthrough contacts 110B is removed through the opening 210, as shown in FIG. 22A. In some embodiments, two feedthrough contacts 110B are exposed at the bottom of the opening 210, but the number of the feedthrough contacts exposed in one opening 210 is not limited to two and is one, three or more in other embodiments. In some embodiments, the gate dielectric layer 102 made of a high-k dielectric material is not etched and is exposed at the bottom of the opening 210.

Figure 23B:
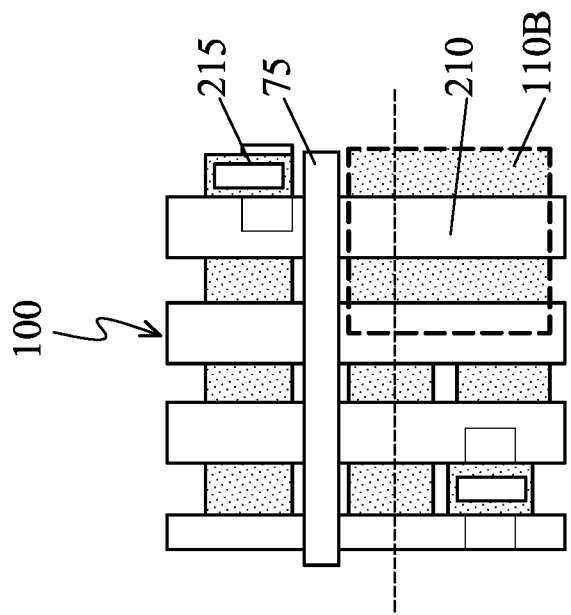
FIGS. 23A and 23B show schematic views of one of the various stages of a sequential manufacturing operation of a semiconductor device according to an embodiment of the present disclosure.
Figure 23A:
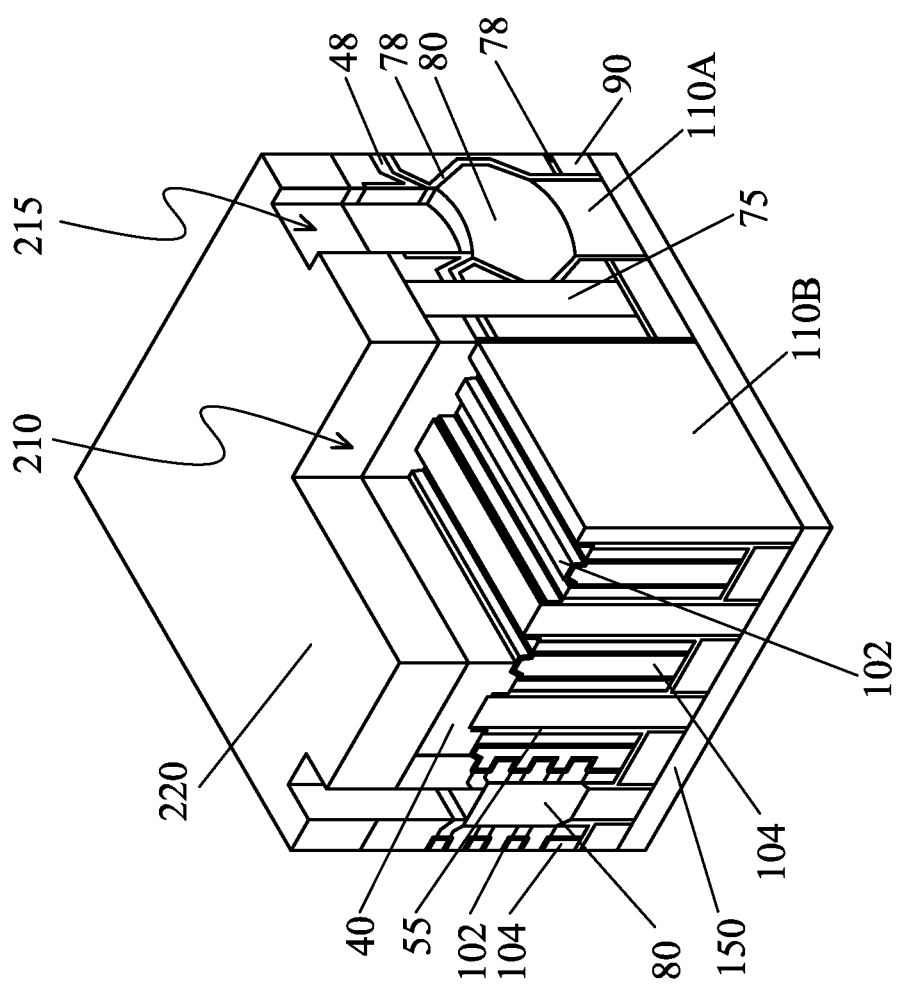

Further, by using one or more lithography and etching operations, the hard mask layer 200 is patterned to form an opening 215, and then the well portion 11 of the fin structure and first epitaxial layer 81 below the source/drain epitaxial layer 80 and the dielectric layer 48 are removed to expose the source/drain epitaxial layer 80 at the bottom of the opening 215, as shown in FIGS. 23A and 23B.

Figure 24B:
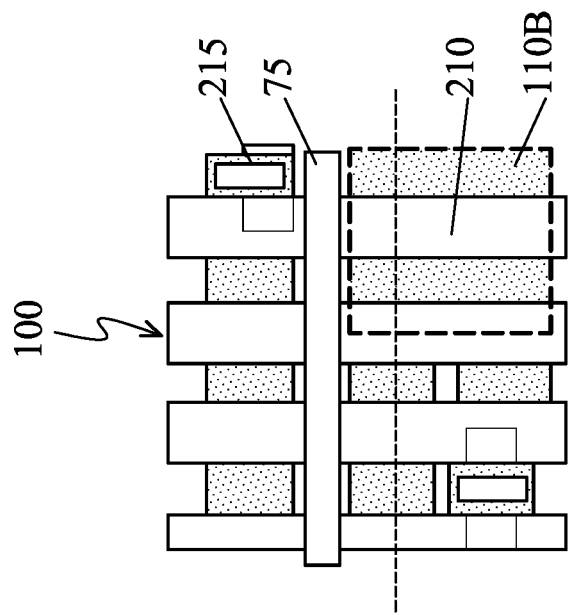
FIGS. 24A and 24B show schematic views of one of the various stages of a sequential manufacturing operation of a semiconductor device according to an embodiment of the present disclosure.
Figure 24A:
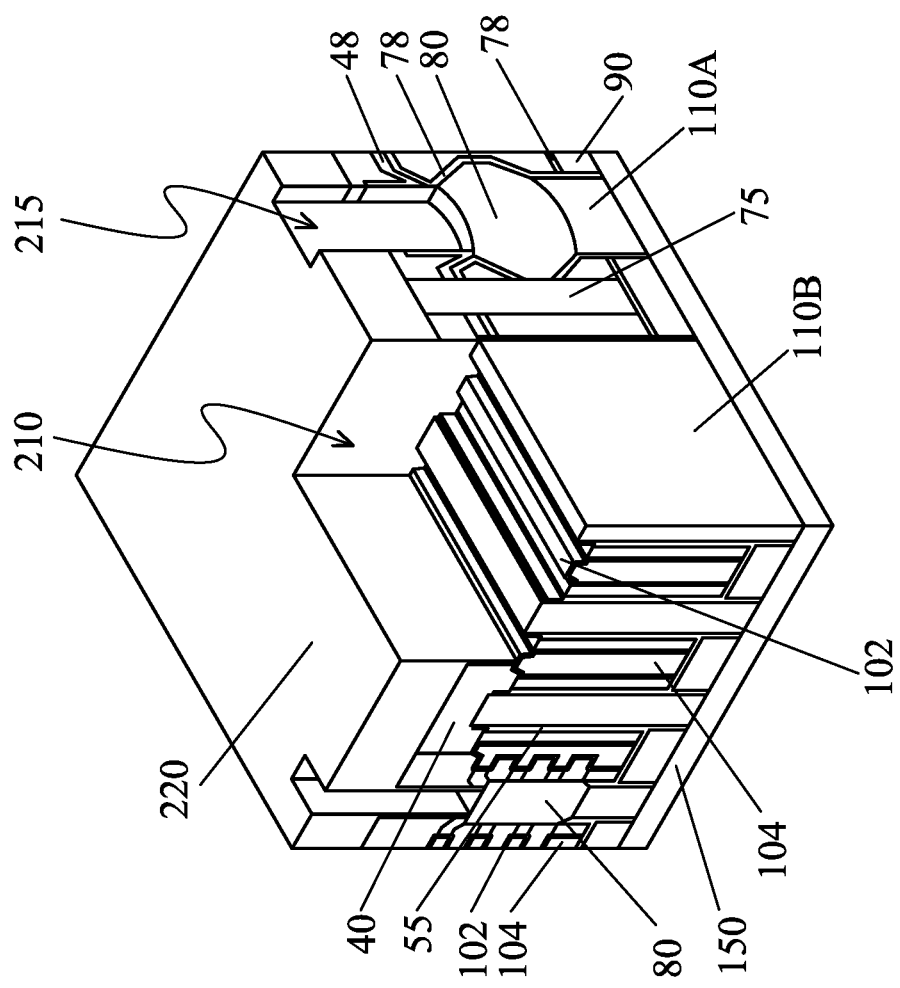

Then, as shown in FIGS. 24A and 24B, a dielectric liner layer 220 is formed on the inner sidewall of the openings 210 and 215 by deposition and anisotropic etching operations. In some embodiments, the dielectric liner layer 220 is made of silicon nitride, SiCN or any other suitable material.

Figures 25A, 25B:
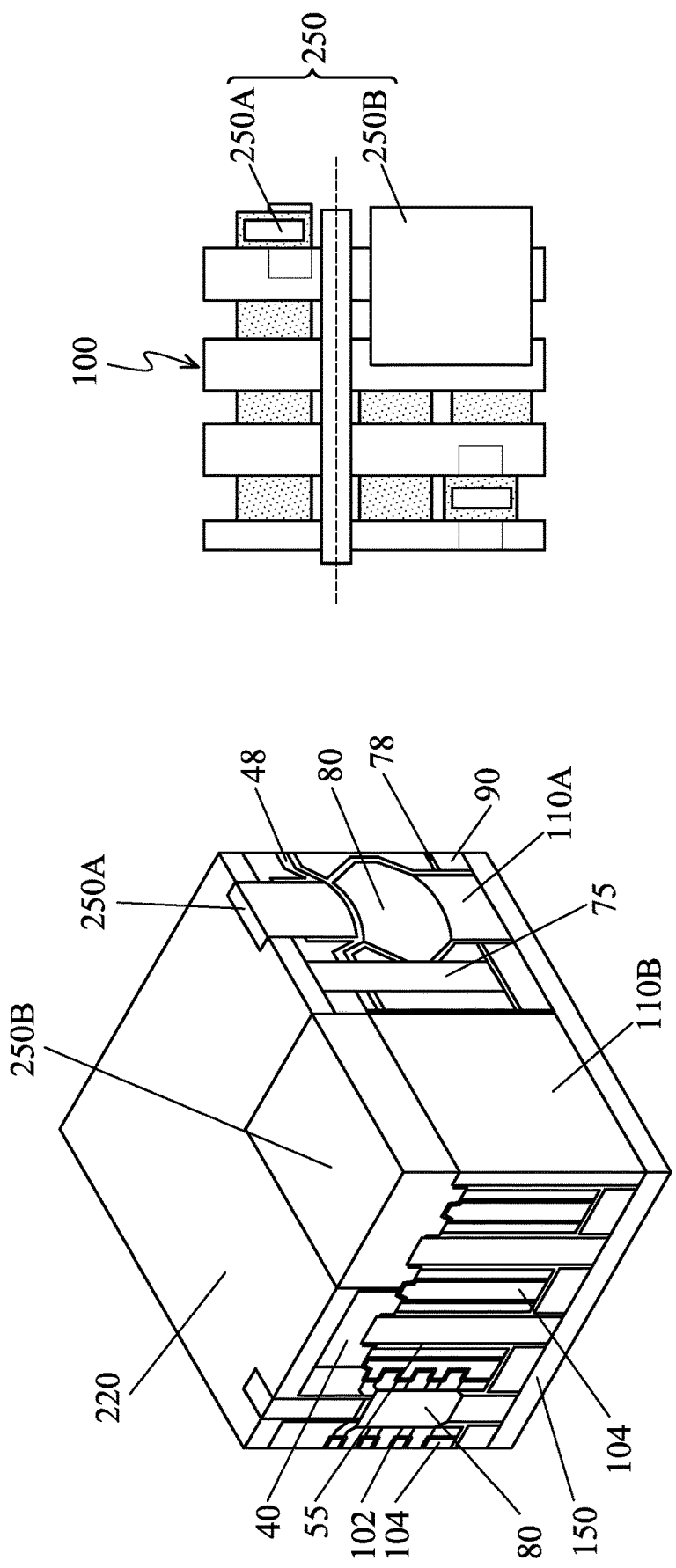
FIGS. 25A and 25B show schematic views of one of the various stages of a sequential manufacturing operation of a semiconductor device according to an embodiment of the present disclosure.

Next, one or more conductive material layers are formed in the openings 210 and 215 and over the hard mask layer 200, and then one or more planarization operations (e.g., CMP) are performed to expose the upper surface of the hard mask layer 200, thereby forming a backside source/drain contact 250A contacting the source/drain epitaxial layer 80 and a backside feedthrough contact 250B contacting the feedthrough contact 110B (collectively back contacts 250), as shown in FIGS. 25A and 25B. In some embodiments, the back contact 250 is made of one or more layers of Co, Ru, Cu, W, Ni, Mo, Al, Ti or Ta or an alloy thereof. In some embodiments, the backside contact 250 is made of the same material as or different material than the frontside contact 110. In some embodiments, the backside contact 250 includes a barrier layer made of TiN and/or TaN having a thickness in a range from about 1.1 nm to about 5 nm and a body layer made of Co, Ru, Cu, W, Ni, Mo and/or Al. In some embodiments, no barrier layer is formed, and the body layer is a single metal layer.

The dummy contact 110C is connected to no back contact, and thus, is electrically isolated or floating. In some embodiments, before the backside source/drain contact 250A is formed, a silicide layer (e.g., TiSi, NiSi or CoSi) is formed on the bottom of the source/drain epitaxial layer 80. The thickness of the silicide layer is in a range from about 1.5 nm to about 6 nm in some embodiments. In some embodiments, the backside source/drain contact 250A corresponds to via VB and the feedthrough contact 250B corresponds to FT via shown in FIGS. 1 and 2A-2C.

In some embodiments, the thickness of the backside feedthrough contact 250B is smaller than the thickness of the backside source/drain contact 250A. In some embodiments, the thickness of the backside feedthrough contact 250B is in a range from about 10 nm to about 30 nm and the thickness of the backside source/drain contact 250A is in a range from about 12 nm to about 35 nm. In some embodiments, the width of the backside feedthrough contact 250B is in a range from about 60 nm to about 150 nm. In some embodiments, the width of the backside source/drain contact 250A at the top (closer to the epitaxial layer 80) is in a range from about 10 nm to about 50 nm, which is smaller the bottom (closer to the backside wirings) which is in a range from about 20 nm to about 60 nm.

Figure 26A:
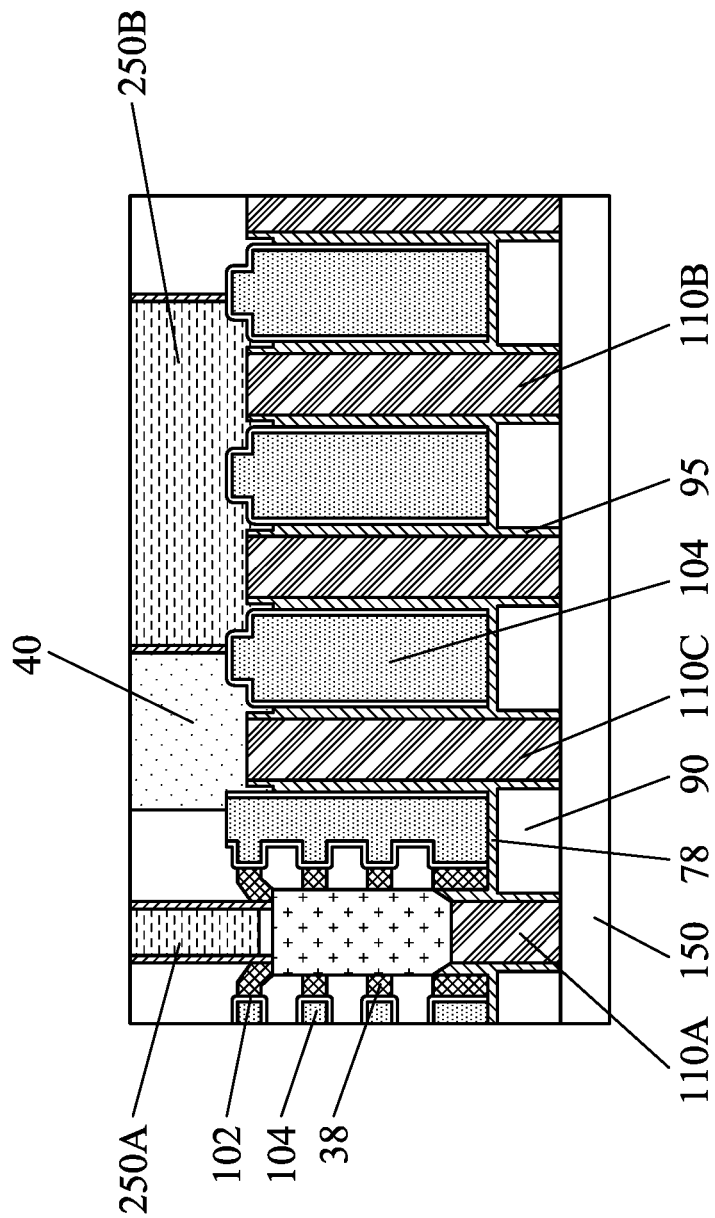
FIGS. 26A and 26B show schematic views of the various stages of a sequential manufacturing operation of a semiconductor device according to an embodiment of the present disclosure.
Figure 26B:
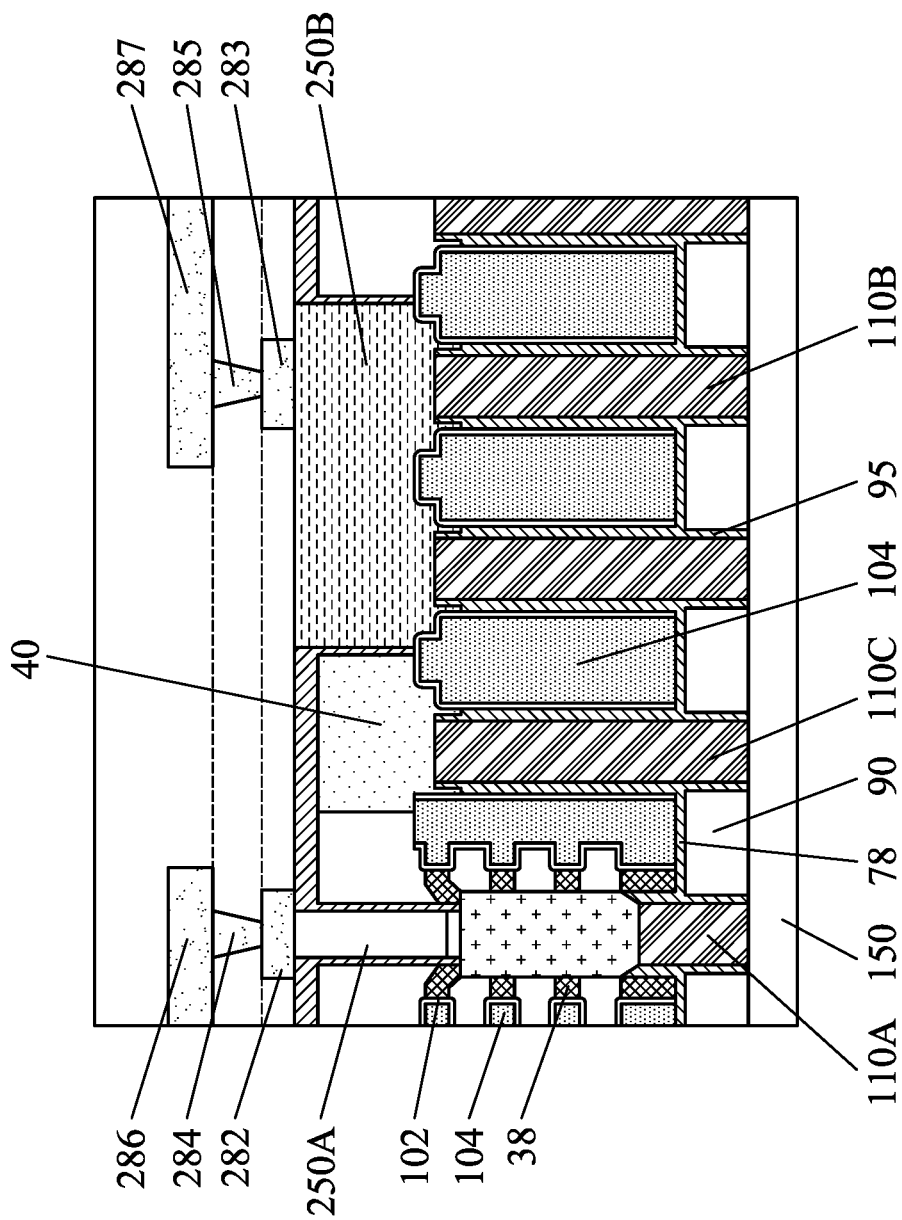

Subsequently, the hard mask layer 200 is removed by one or more CMP operations to expose the isolation insulating layer 40, as shown in FIG. 26A. In other embodiments, the hard mask layer 200 is not removed, and remains as a dielectric or insulating layer. Further, backside wiring patterns are formed over the back side of the substrate. In some embodiments, as shown in FIG. 26B, a first backside wiring pattern 282 is connected to the backside source/drain contact 250A, and a first backside via 284 connects the first backside wiring pattern 282 and a second backside wiring pattern 286. In some embodiments, as shown in FIG. 26B, a third backside wiring pattern 283 is connected to the backside feedthrough contact 250B, and a second backside via 285 connects the third backside wiring pattern 283 and a fourth backside wiring pattern 287. In some embodiments, the wiring patterns 282 and 283 correspond to backside wiring layers BM1 and the wiring patterns 284 and 287 correspond to backside wiring layers BM2 shown in FIGS. 1A-3.

In some embodiments, the vertical length (height) of the frontside feedthrough contact 110B is in a range from about 20 nm to about 80 nm and is greater than the source/drain contact 110A.

FIGS. 27A, 27B and 27C to FIG. 36 show schematic views of the various stages of a sequential manufacturing operation of a semiconductor device according to an embodiment of the present disclosure. It is understood that additional operations can be provided before, during, and after the processes shown by FIGS. 27A-36, and some of the operations described below can be replaced or eliminated, for additional embodiments of the method. The order of the operations/processes may be interchangeable. Materials, configurations, dimensions, processes and/or operations as explained with respect to the foregoing embodiments may be employed in the following embodiments, and the detailed description thereon may be omitted. In FIGS. 27A, 27B and 27C to FIGS. 35A, 35B and 35C, the "A" figures show perspective views, the "B" figures show plan views (layout views), and the "C" figures show cross sectional views.

Figures 27A, 27B, 27C:
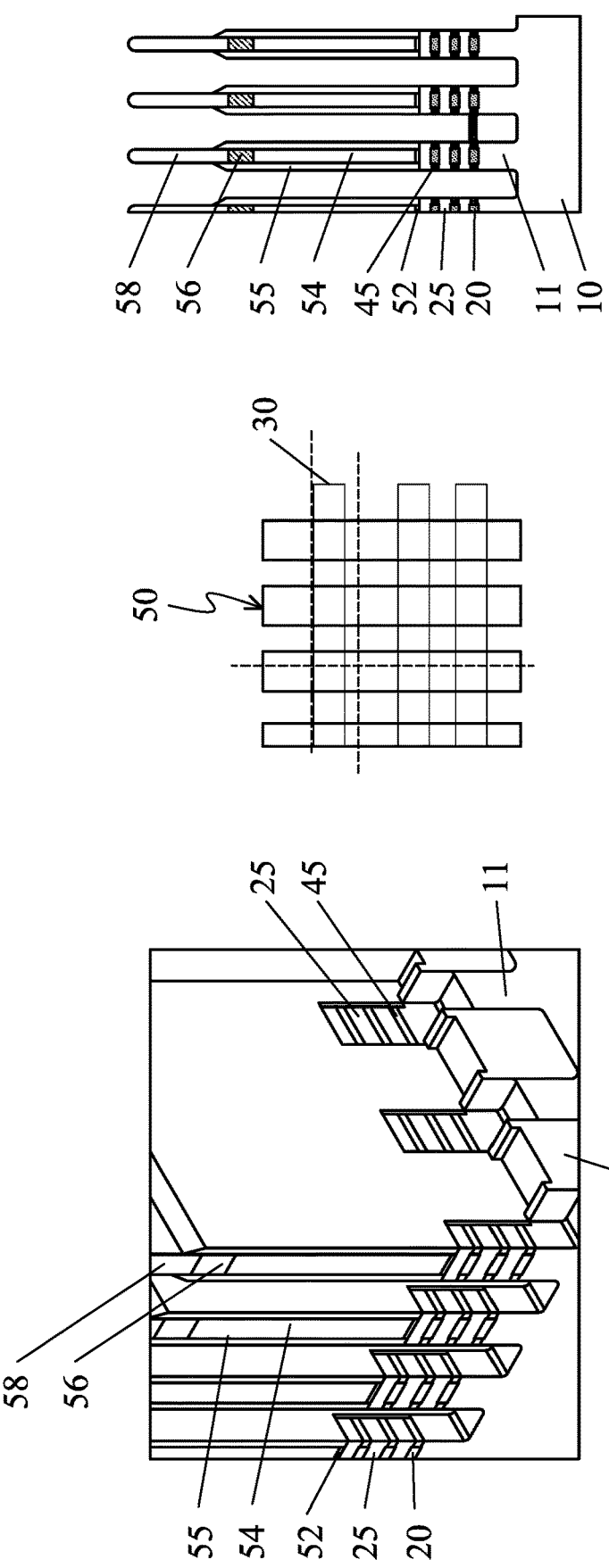
FIGS. 27A, 27B and 27C show schematic views of one of the various stages of a sequential manufacturing operation of a semiconductor device according to an embodiment of the present disclosure.

FIGS. 27A-27C correspond to the process stage after the inner spacers 45 are formed as explained with respect to FIGS. 15A and 15B. In some embodiments, three or more fin structures 30 are provided and four or more sacrificial gate structures 50 are disposed over the three or more fin structures 30 as shown in FIG. 27B.

Figure 28A:
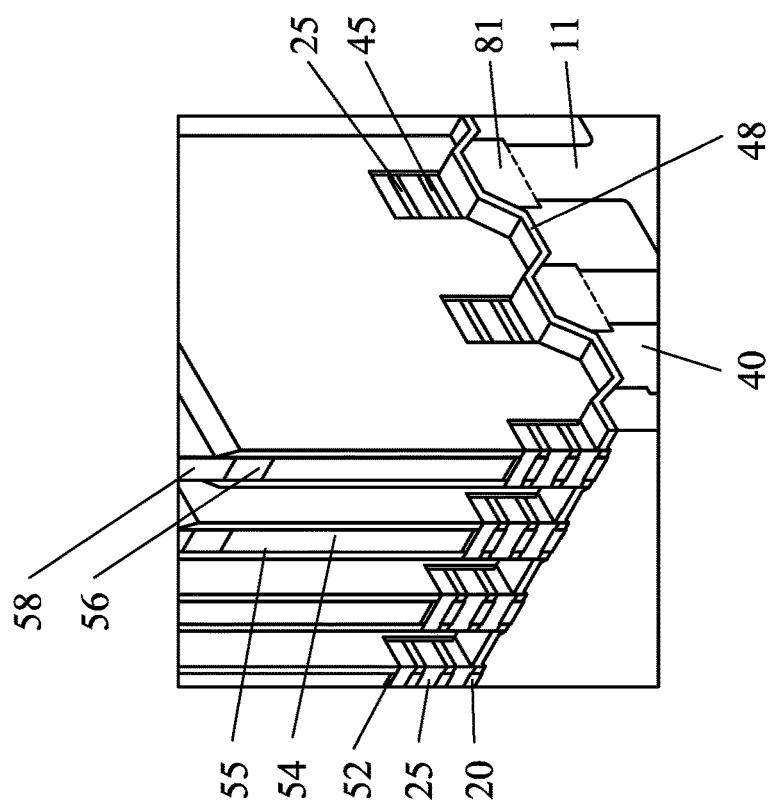
FIGS. 28A, 28B and 28C show schematic views of one of the various stages of a sequential manufacturing operation of a semiconductor device according to an embodiment of the present disclosure.
Figure 28B:
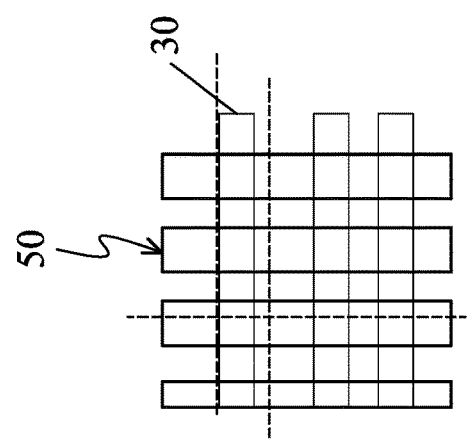
Figure 28C:
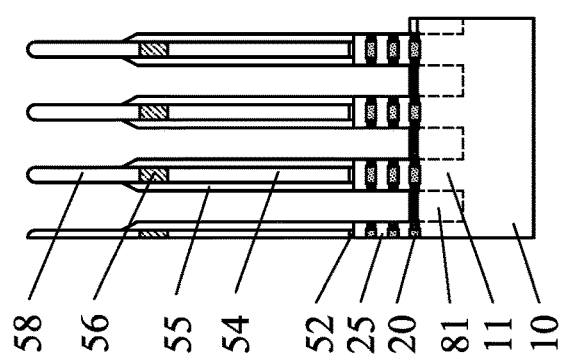

After the inner spacers 45 are formed, similar to the operations as explained with respect to FIGS. 16A and 16B, a first epitaxial layer 81 is formed over the recessed fin structure 11, and then a dielectric layer 48 is formed over the first epitaxial layer 81 and the isolation insulating layer 40, as shown in FIGS. 28A-28C.

Figure 29C:
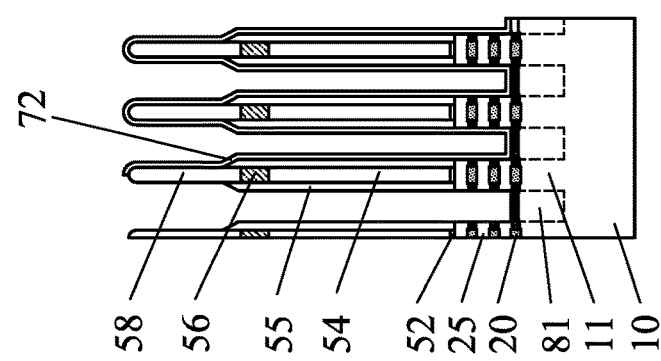
FIGS. 29A, 29B and 29C show schematic views of one of the various stages of a sequential manufacturing operation of a semiconductor device according to an embodiment of the present disclosure.
Figure 29B:
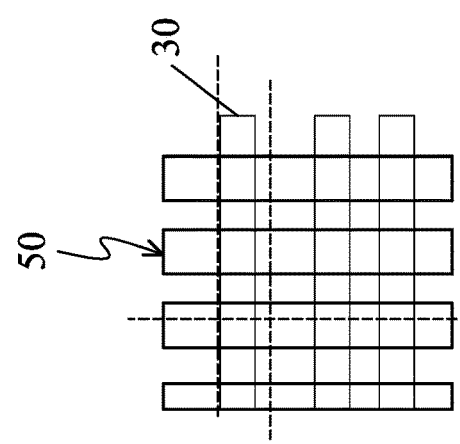
Figure 29A:
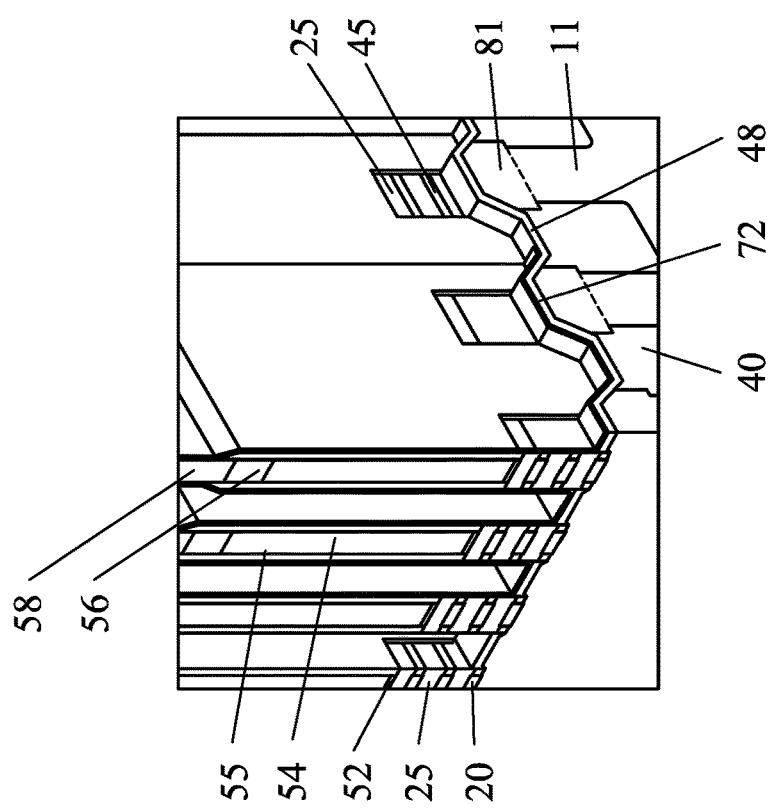

Then, as shown in FIGS. 29A-29C, a liner mask layer 72 is conformally formed over the sacrificial gate structures 50 and the source/drain space. In some embodiments, the liner mask layer 72 is made of a different material than the dielectric layer 48 and the gate sidewall spacers 45, and includes one or more of aluminum oxide, hafnium oxide, zirconium oxide or any other suitable dielectric material. Further, by using one or more lithography and etching operations, a part of the liner mask layer 72 is removed at the region where a source/drain epitaxial layer 80 is subsequently formed.

Figure 30A:
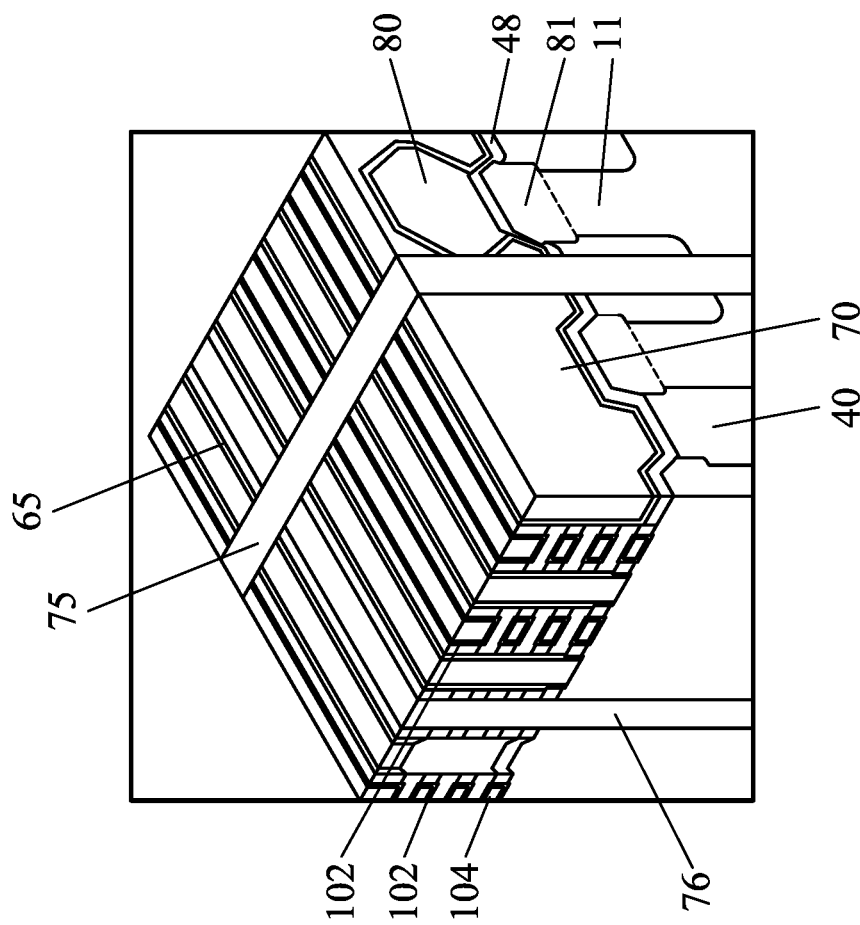
FIGS. 30A, 30B and 30C show schematic views of one of the various stages of a sequential manufacturing operation of a semiconductor device according to an embodiment of the present disclosure.
Figure 30C:
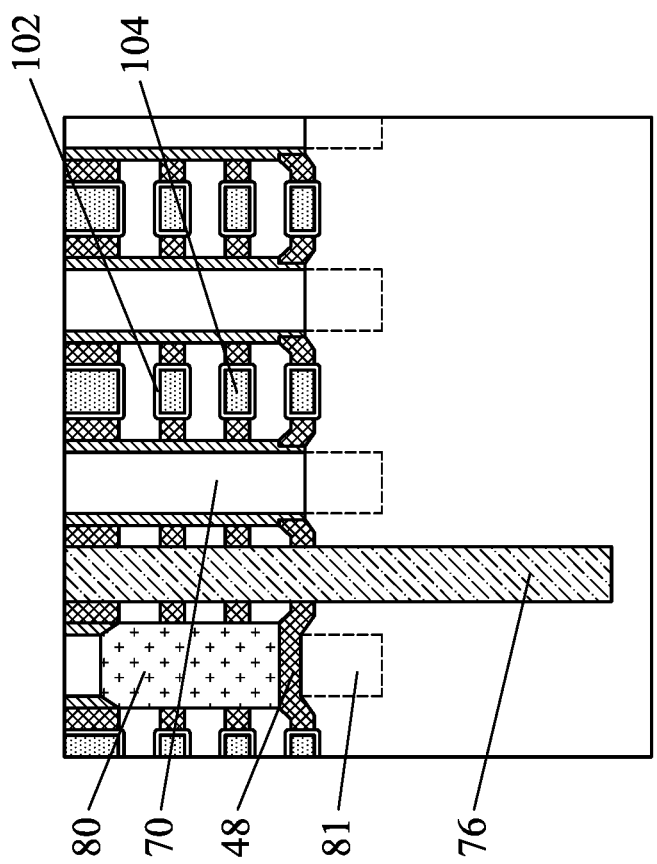
Figure 30B:
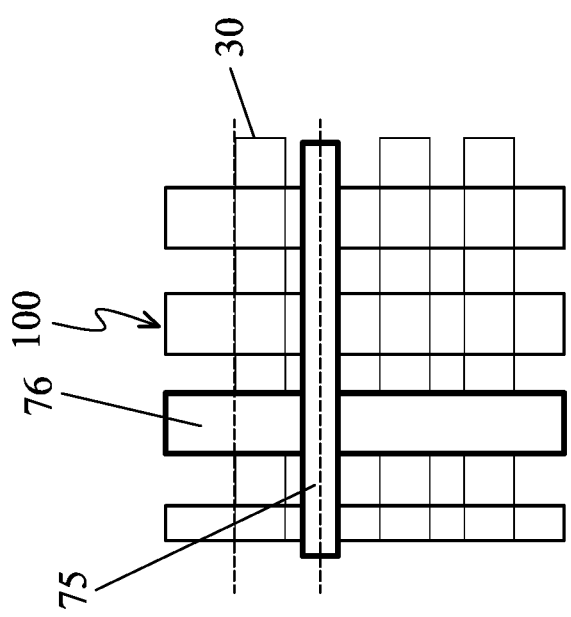

Next, similar to the operations as explained with respect to FIGS. 17A and 17B, a source/drain epitaxial layer 80 is formed on the end faces of the second semiconductor layers 25 at the region where the liner mask layer 72 is removed. Further, similar to the operations as explained with respect to FIGS, 18A and 18B, a first etch stop layer (ESL) 65 is formed over the sacrificial gate structure 50 and the S/D epitaxial layer 80, and a first ILD layer 70 is formed over the CESL 65. Then, the sacrificial gate electrode 54 and sacrificial gate dielectric layer 52 are removed, the first semiconductor layers 20 are removed, thereby forming wires or sheets (channel regions) of the second semiconductor layers 25, and then a metal gate structure is formed, as shown in FIGS. 30A-30C. In some embodiments, a void or a gap is formed between the epitaxial layer 80 and the dielectric layer 48.

Further, as shown in FIGS. 30A-30C, the metal gate structures 100 are cut by a groove or trench and the groove or the trench is filled with a dielectric material, thereby forming a gate separation wall 75. In addition, in some embodiments, one or more channel regions (fin structures) are cut by a groove or trench and the groove or the trench is filled with a dielectric material, thereby forming a fin separation wall 76, as shown in FIGS. 30A-30C. The groove or trench penetrate into the substrate 10 passing through the isolation insulating layer 40. In some embodiments, the fin separation wall 76 is made of silicon nitride or any other suitable dielectric material.

Figure 31A:
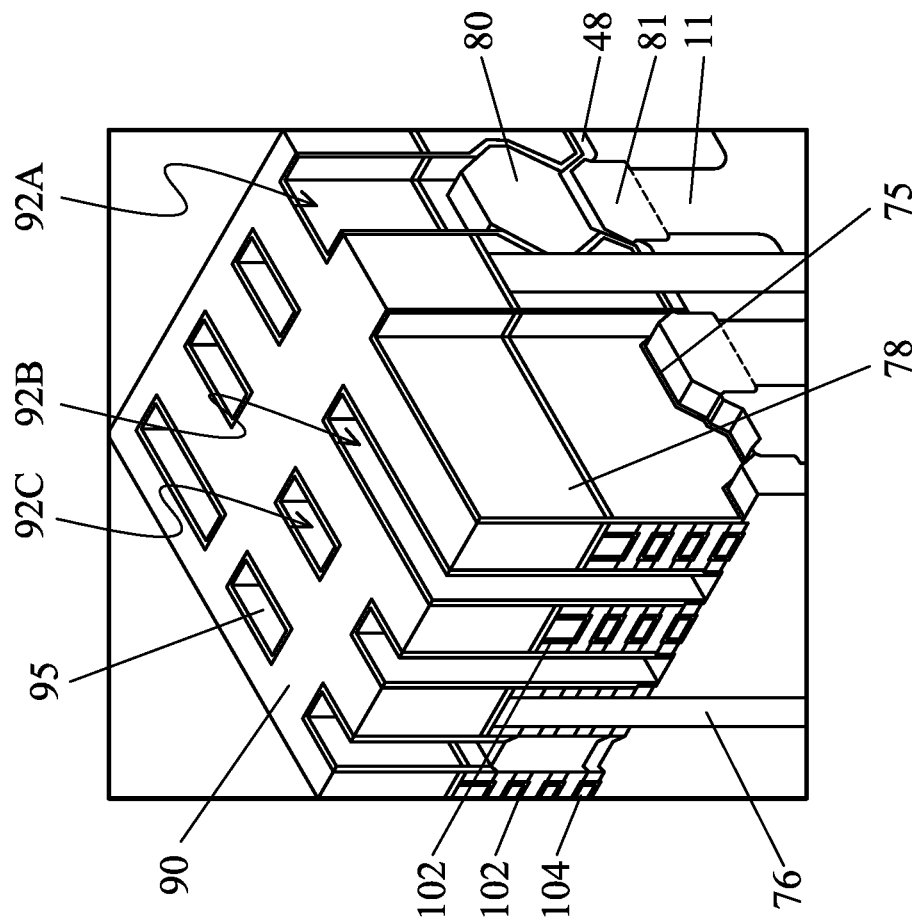
FIGS. 31A, 31B and 31C show schematic views of one of the various stages of a sequential manufacturing operation of a semiconductor device according to an embodiment of the present disclosure.
Figure 31C:
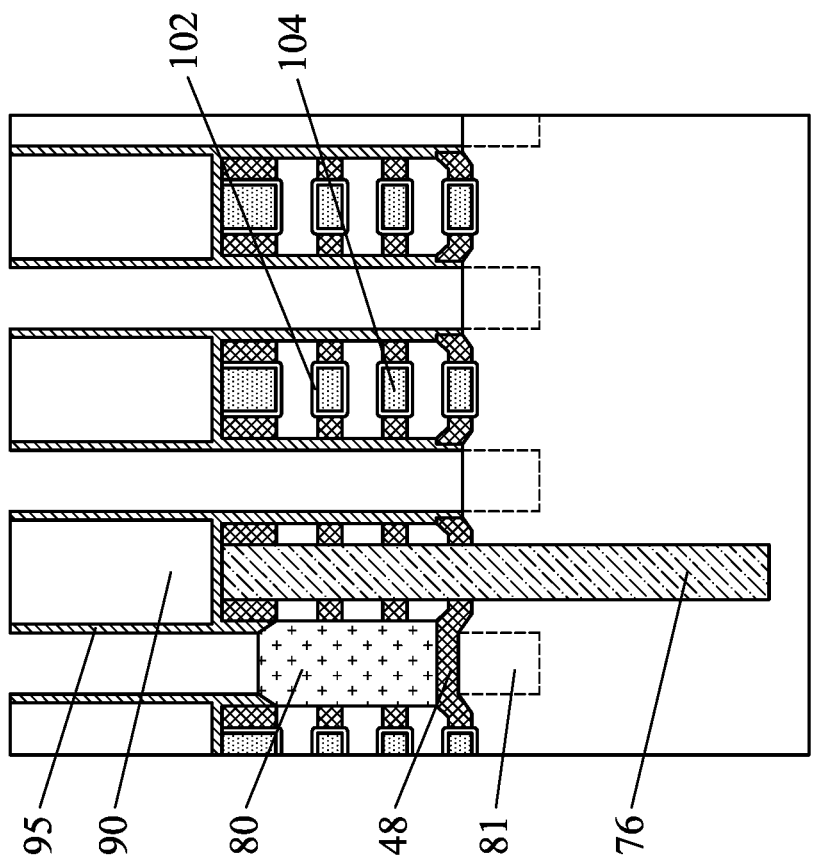
Figure 31B:
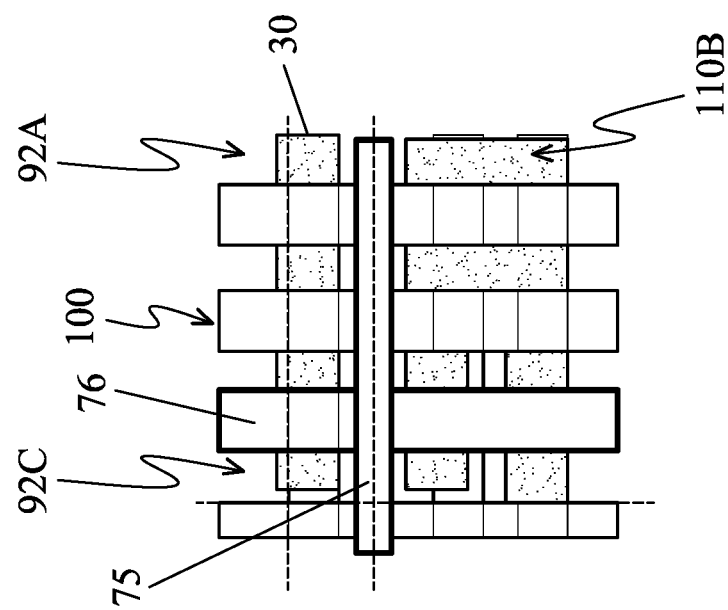

Next, similar to the operations as explained with respect to FIGS. 19A and 19B, a second ESL 78 is formed over the metal gate structures 100 and then a second ILD layer 90 is formed over the second ESL 78. Further, first openings 92A for a source/drain contact and second openings 92B for a feedthrough contact are formed in the second ILD layer 90 and the first ILD layer 70. In some embodiments, one or more third openings 92C as dummy patterns are formed to improve process uniformity. Then, a liner dielectric layer 95 is formed on the inner sidewall of the first and second openings by deposition and anisotropic etching operations. At the bottom of the first opening 92A, the source/drain epitaxial layer 80 is exposed, and at the bottom of the second and third openings 92B, 92C, the isolation insulating layer 40 and/or the first epitaxial layer 81 are exposed as shown in FIGS. 31A and 31C.

Figure 32A:
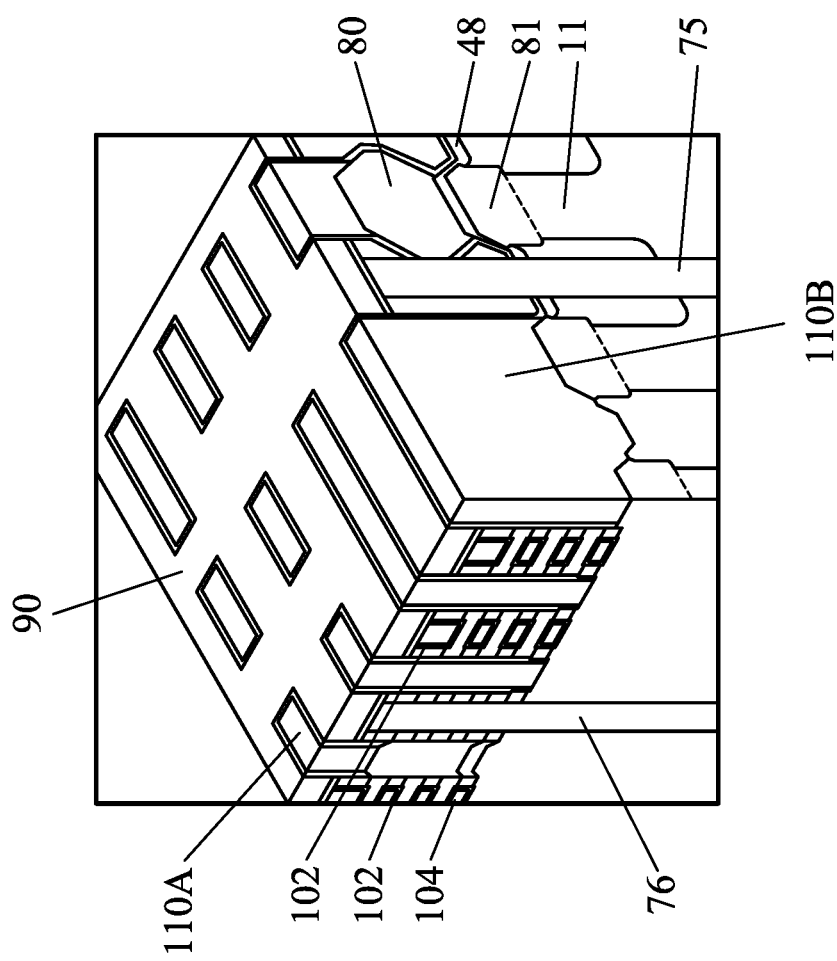
FIGS. 32A, 32B and 32C show schematic views of one of the various stages of a sequential manufacturing operation of a semiconductor device according to an embodiment of the present disclosure.
Figure 32C:
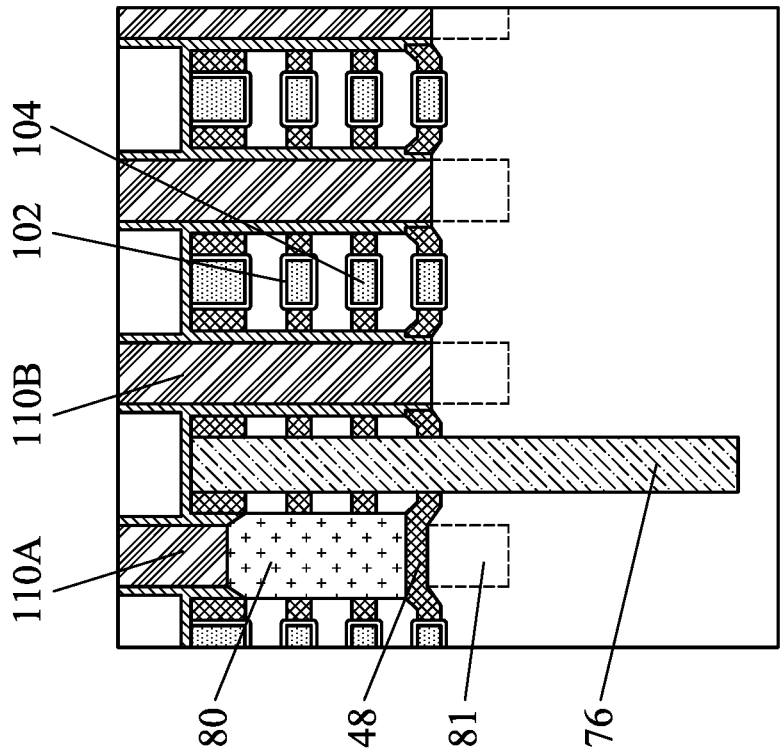
Figure 32B:
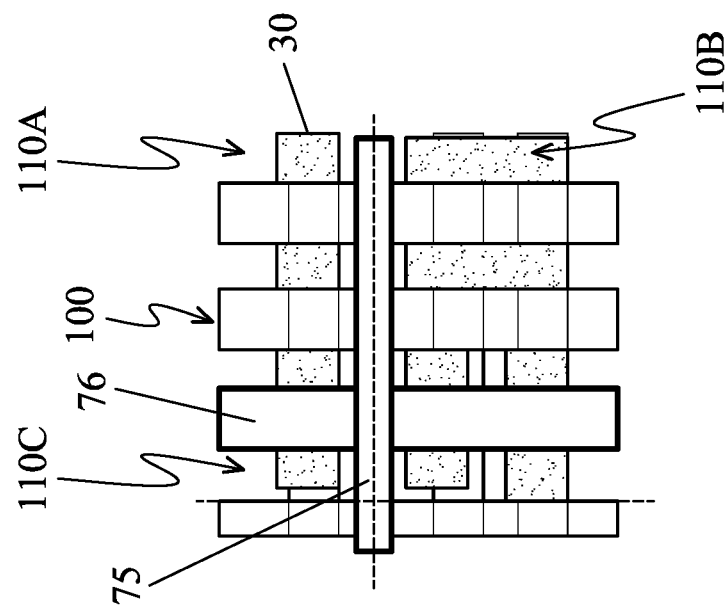

Next, similar to the operations as explained with respect to FIGS. 20A and 20B, one or more conductive material layers are formed in the first, second and third openings and over the second ILD layer 90, and then one or more planarization operations are performed to expose the upper surface of the second ILD layer 90, thereby forming a source/drain contact 110A contacting the source/drain epitaxial layer 80, a feedthrough contact 110B and a dummy contact 110C (collectively front contacts 110), as shown in FIGS. 32A-32C.

Subsequently, similar to the operation as explained with respect to FIGS. 21A-21C, one or more front wiring layers are formed over the second ILD layer 90 and the front contacts 110, and a carrier substrate is attached over the wiring layers or one or more layers formed over the wiring layers. Then, the substrate is flipped, and a hard mask layer 200 is formed over the etched backside of the substrate.

Figure 33A:
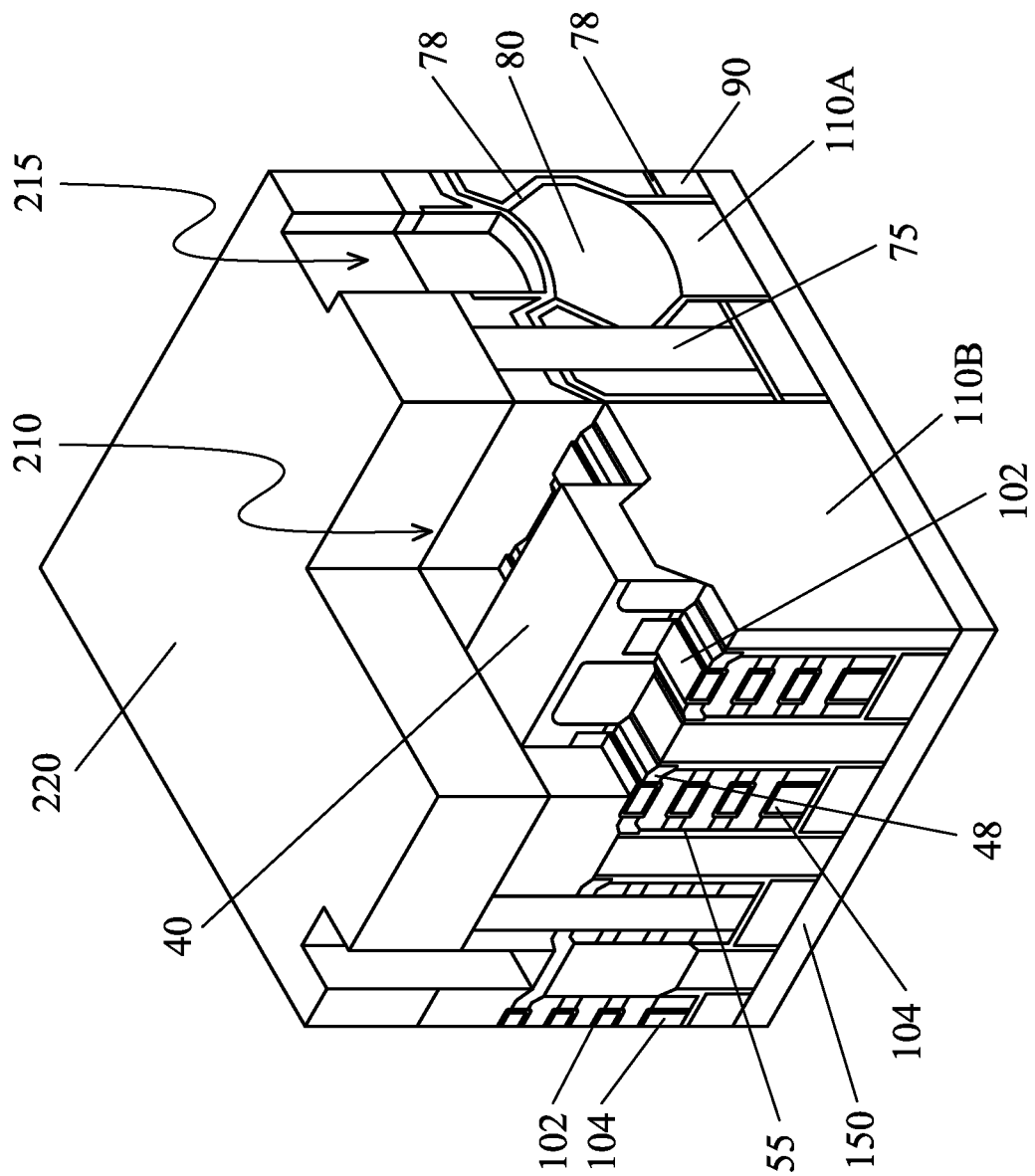
FIGS. 33A, 33B and 33C show schematic views of one of the various stages of a sequential manufacturing operation of a semiconductor device according to an embodiment of the present disclosure.
Figure 33C:
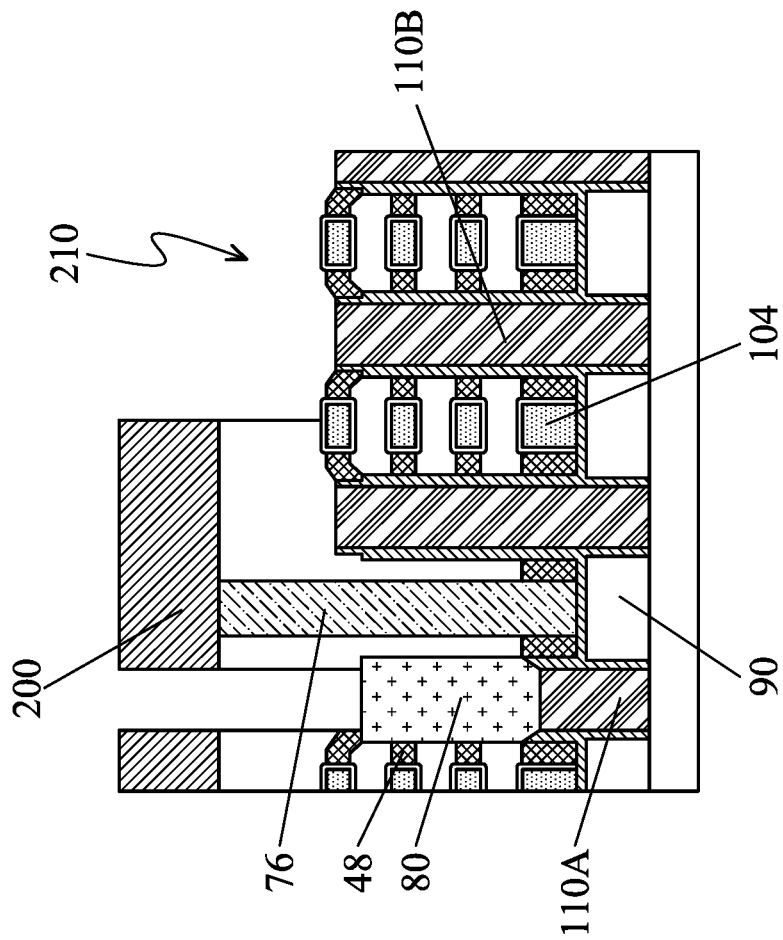
Figure 33B:
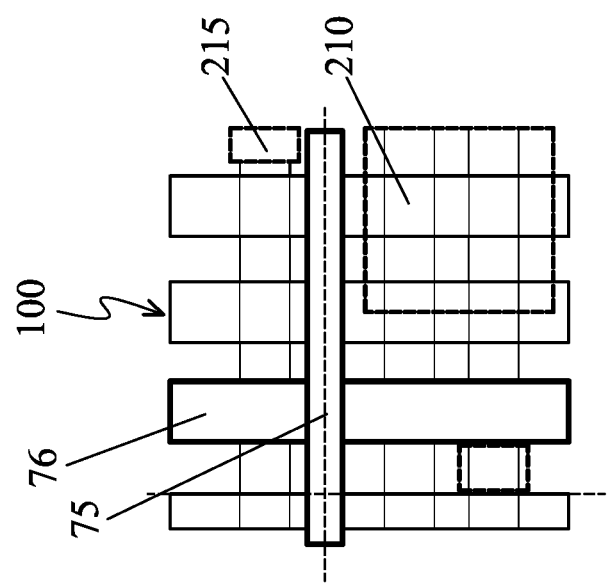

Then, by using one or more lithography and etching operations, the hard mask layer 200 is patterned to form an opening 210, and then the fin structure 11 and the first epitaxial layer 81 are removed through the opening 210, as shown in FIGS. 33A-33C. In some embodiments, the isolation insulating layer 40 and the bottom part of the fin structure remain as shown in FIG. 33A. In other embodiments, the isolation insulating layer 40 exposed in the opening 210 is further removed. Depending on the layout or design requirements, a part of the isolation insulating layer 40 and a bottom part of the fin structures are exposed in the opening 210.

In some embodiments, two feedthrough contacts 110B are exposed at the bottom of the opening 210 and are partially covered by the remaining fin or first epitaxial layer and the remaining isolation insulating layer. Further, by using one or more lithography and etching operations, the hard mask layer 200 is patterned to form an opening 215, and then the well portion 11 of the fin structure and first epitaxial layer 81 below the source/drain epitaxial layer 80 and the dielectric layer 48 are removed to expose the source/drain epitaxial layer 80 at the bottom of the opening 215, as shown in FIGS. 33A and 33C.

Figure 34A:
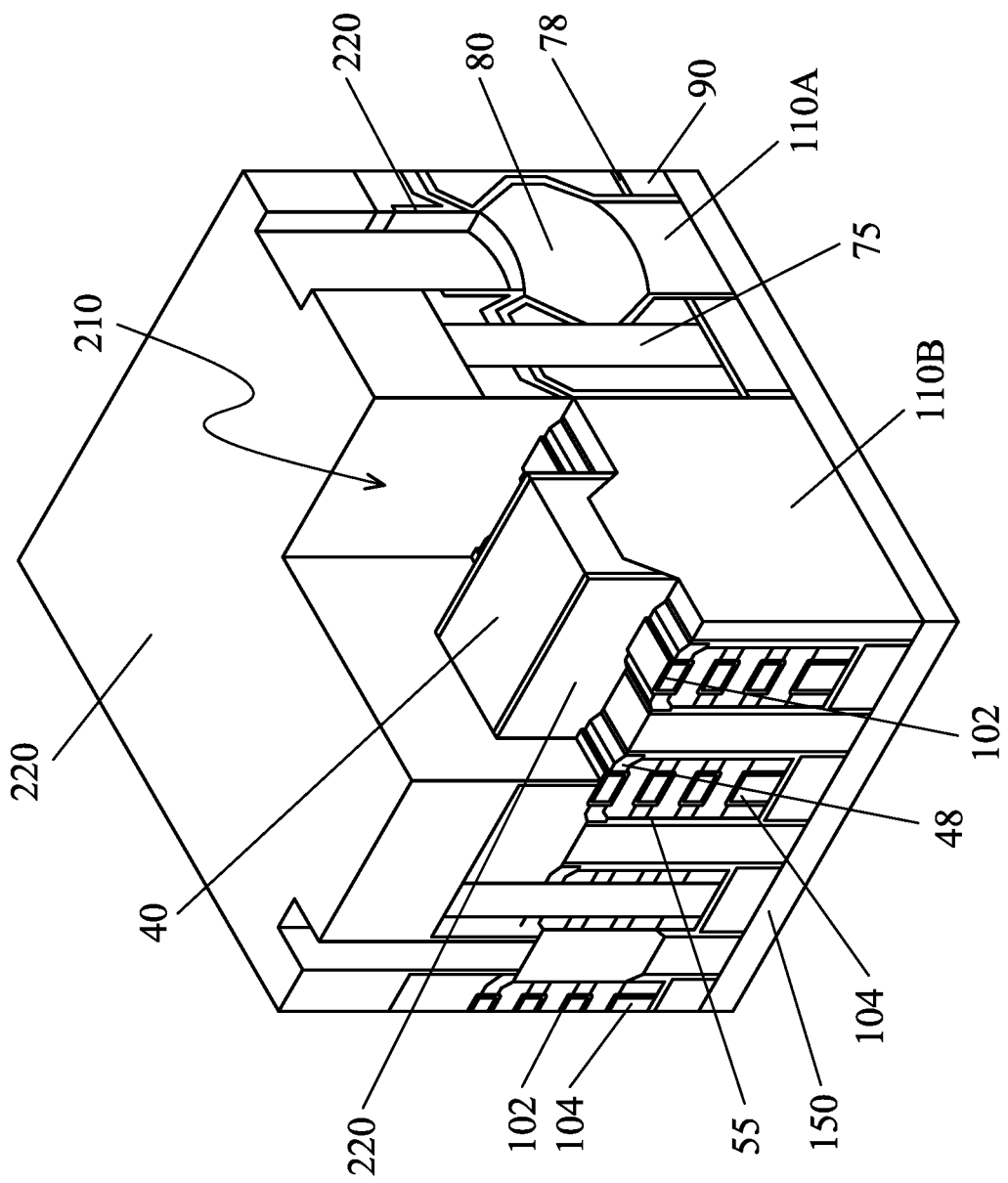
FIGS. 34A, 34B and 34C show schematic views of one of the various stages of a sequential manufacturing operation of a semiconductor device according to an embodiment of the present disclosure.
Figure 34C:
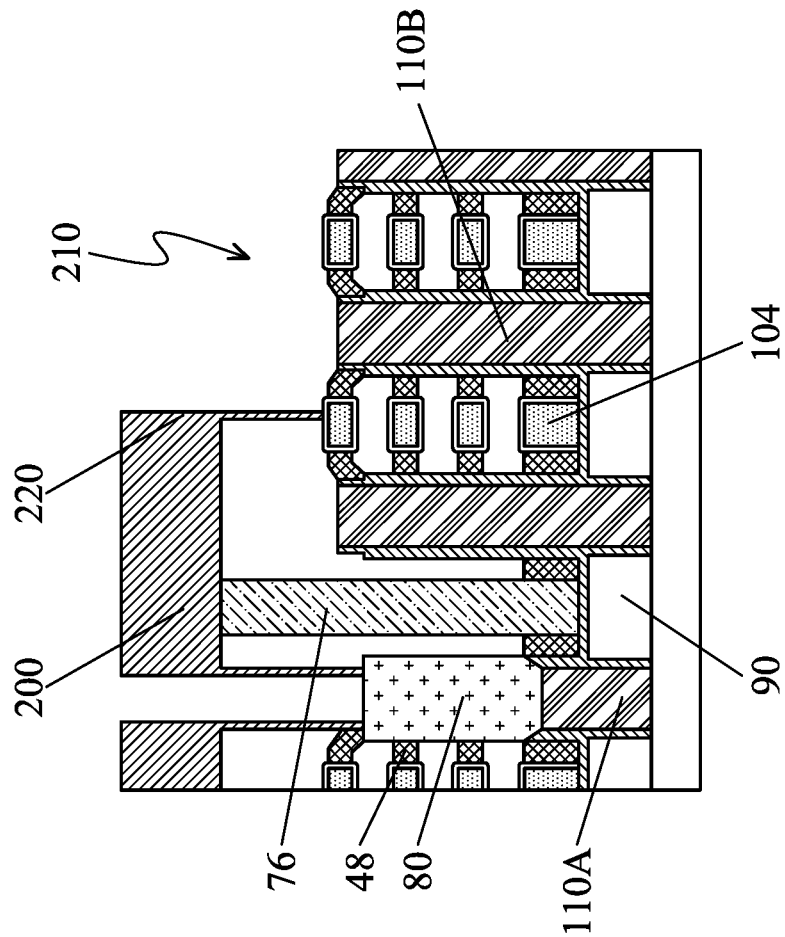
Figure 34B:
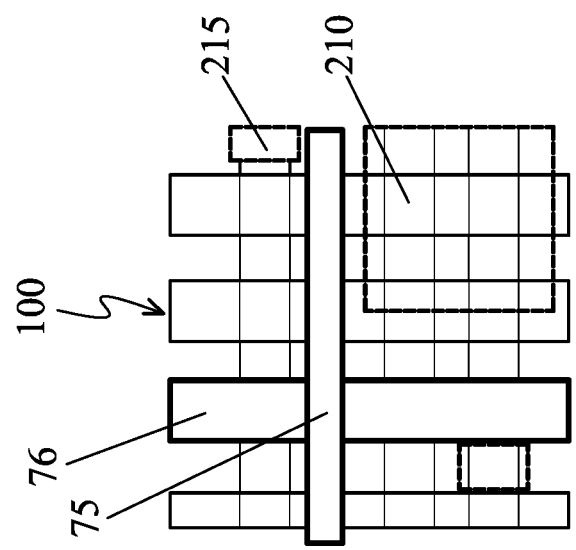

Then, similar to the operations as explained with respect to FIGS. 24A and 24B, a dielectric liner layer 220 is formed on the inner sidewall of the openings 210 and 215 by deposition and anisotropic etching operations, as shown in FIGS. 34A-34C. In some embodiments, the dielectric liner layer 220 is formed on sidewall of the remaining fin or first epitaxial layer and the remaining isolation insulating layer.

Figure 35A:
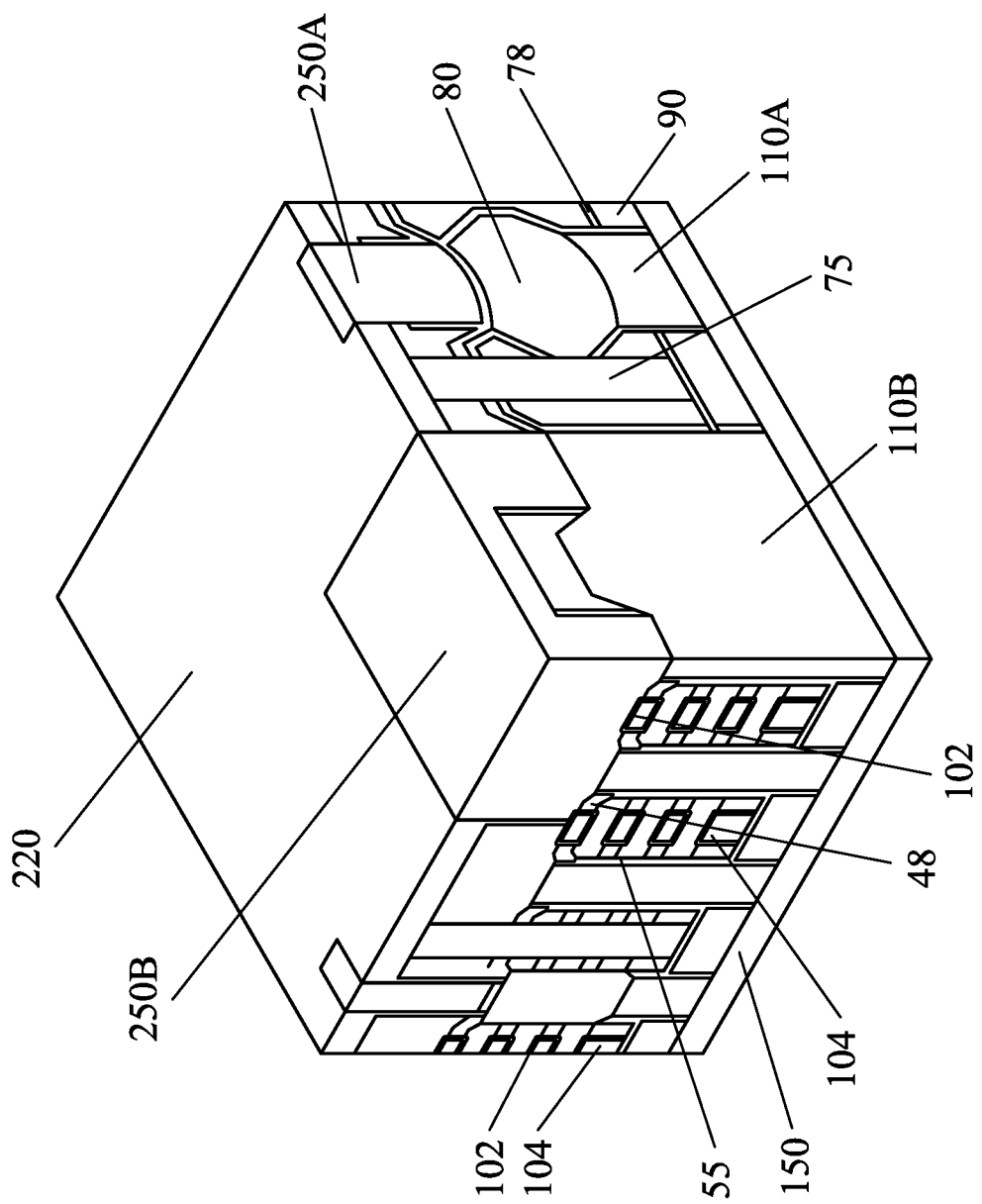
FIGS. 35A, 35B and 35C show schematic views of one of the various stages of a sequential manufacturing operation of a semiconductor device according to an embodiment of the present disclosure.
Figure 35C:
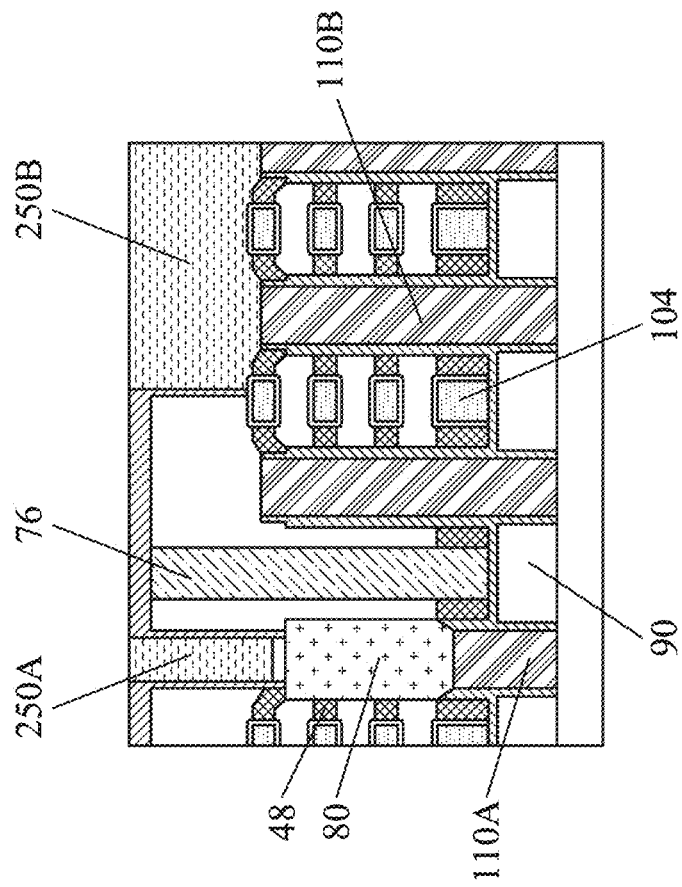
Figure 35B:
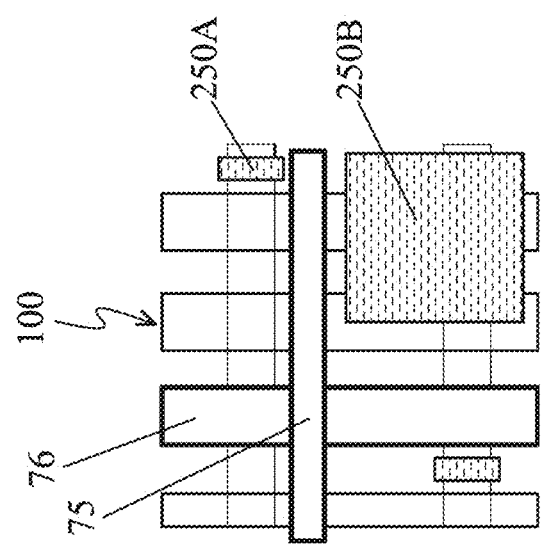

Next, similar to the operations as explained with respect to FIGS. 25A and 25B, one or more conductive material layers are formed in the openings 210 and 215 and over the hard mask layer 200, and then one or more planarization operations (e.g., CMP) are performed to expose the upper surface of the hard mask layer 200, thereby forming a backside source/drain contact 250A contacting the source/drain epitaxial layer 80 and a backside feedthrough contact 250B contacting the feedthrough contact 110B (collectively back contacts 250), as shown in FIGS. 35A-35C. As shown in FIG. 35A, the backside feedthrough contact 250B contacts the feedthrough contact 110B and the isolation insulating layer 40.

Figure 36:
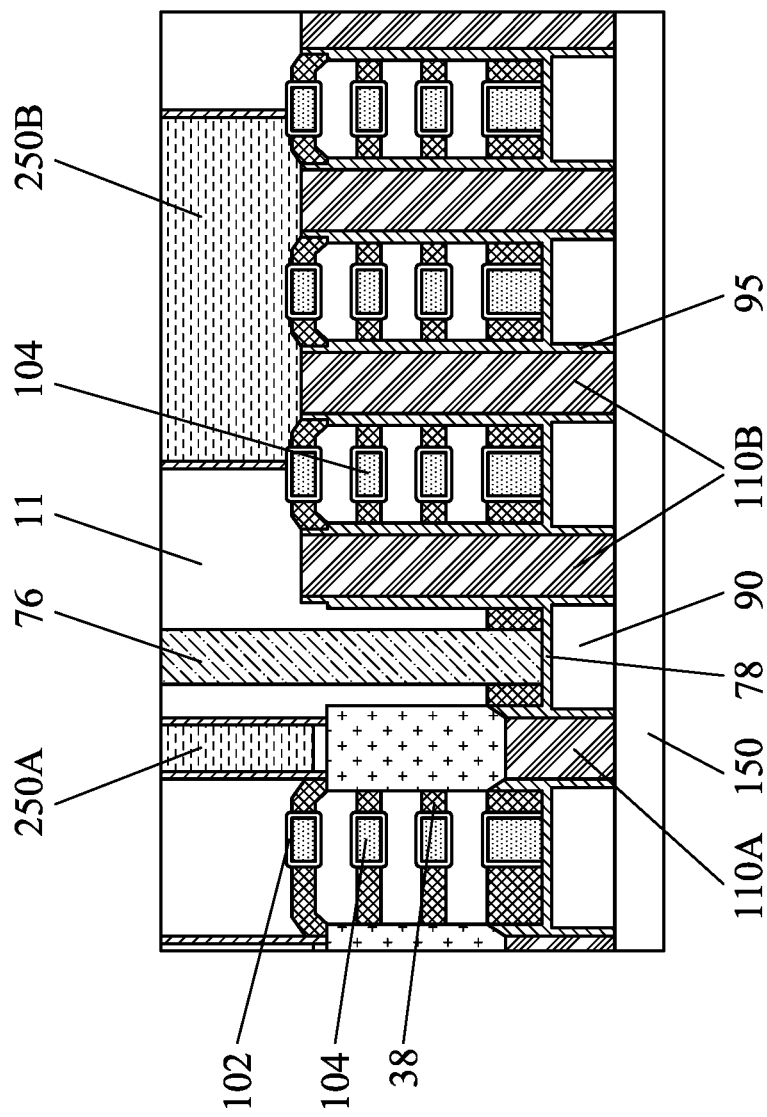
FIG. 36 shows a schematic view of one of the various stages of a sequential manufacturing operation of a semiconductor device according to an embodiment of the present disclosure.

Subsequently, similar to the operations as explained with respect to FIG. 26A, the hard mask layer 200 is removed by one or more CMP operations to expose the isolation insulating layer, as shown in FIG. 36. In other embodiments, the hard mask layer 200 is not removed, and remains as a dielectric or insulating layer. Further, backside wiring patterns are formed over the back side of the substrate, similar to FIG. 26B.

In the embodiments of FIG. 36, fin structures (active regions) are formed to have a long stripe shape and extend through the boundary of cells. In the embodiments, of FIG. 26B, fin structures (active regions) are formed to have a long stripe shape and are cut by one or more patterning operations.

Figure 37A:
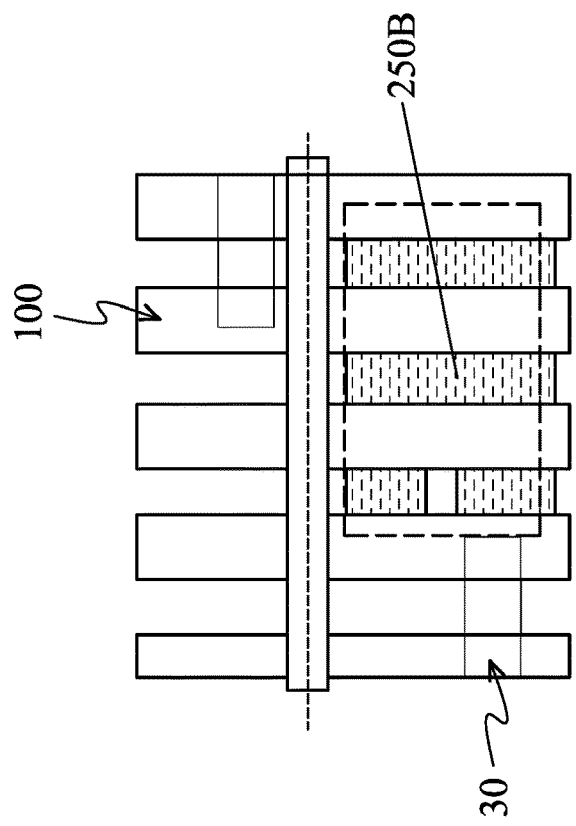
FIGS. 37A and 37B show schematic views of semiconductor devices according to embodiments of the present disclosure.
Figure 37B:
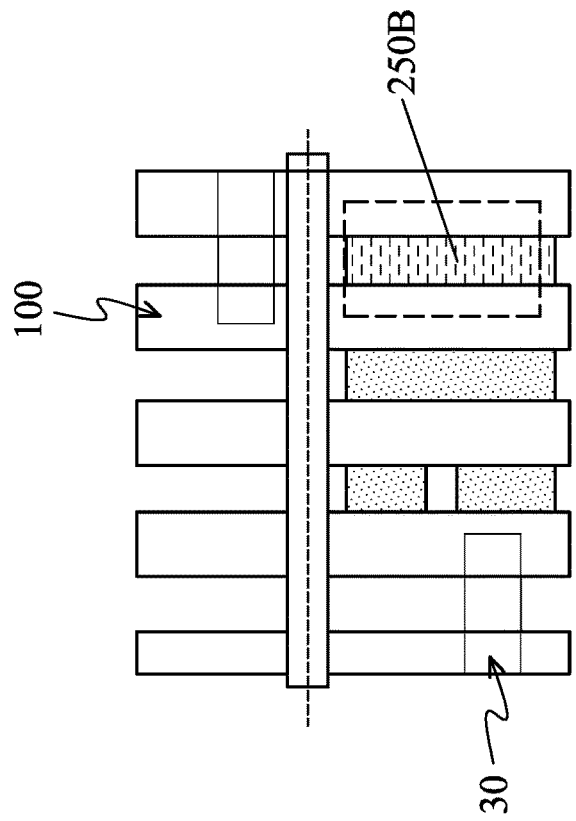

FIGS. 37A and 37B show schematic views (plan or layout views) of a semiconductor device according to embodiments of the present disclosure.

In some embodiments, the backside feedthrough contact 250B contacts only one feedthrough contact as shown in FIG. 37A. In some embodiments, the backside feedthrough contact 250B contacts three or more feedthrough contacts as shown in FIG. 37B.

Figure 38A:
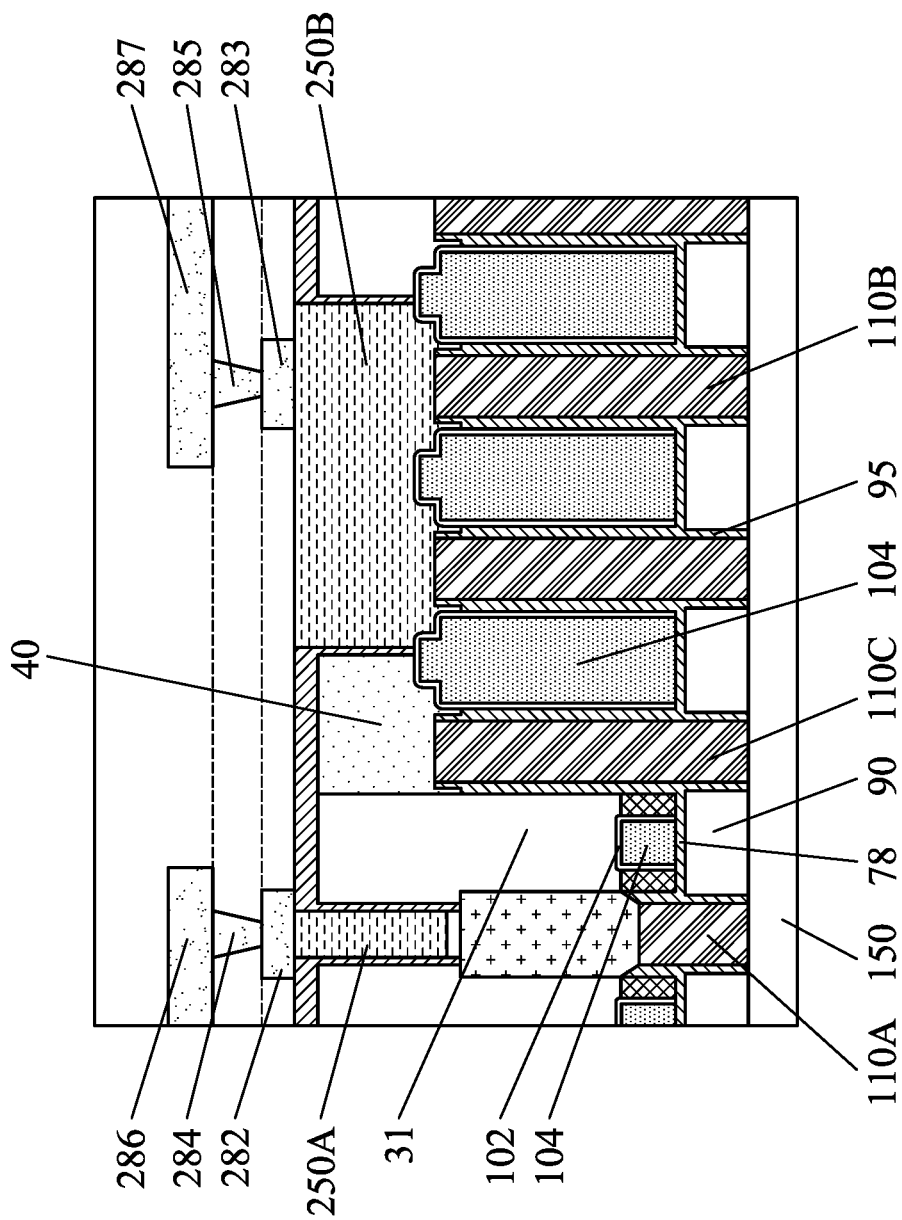
FIGS. 38A and 38B show schematic views of semiconductor devices according to embodiments of the present disclosure.
Figure 38B:
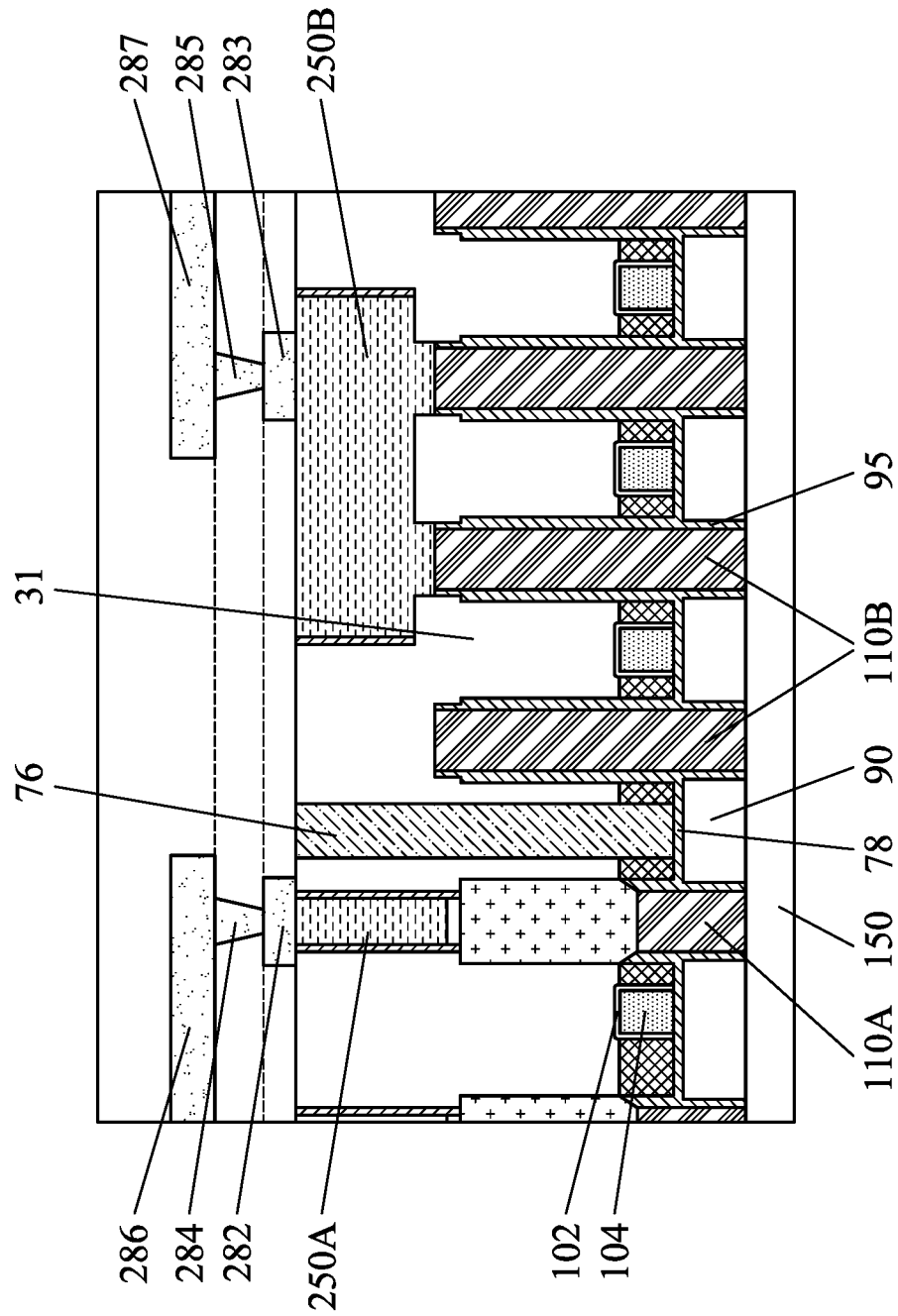

In the foregoing embodiments, the FET of the semiconductor device is a GAA FET. In other embodiments, as shown in FIGS. 38A and 38B, the FET is a FinFET formed by a fin structure 31 as a channel region. FIG. 38A corresponds to FIG. 26B and FIG. 38B corresponds to FIG. 36.

In the foregoing embodiments, the output signal from one FET is routed to the backside wiring layer and then to the frontside wiring layer via one or more feedthrough contacts. This structure reduces resistance and/or capacitance of the signal route, and increases flexibility of the circuit layout.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a field effect transistor (FET) having a metal gate structure, a source and a drain over a substrate and dummy metal gate structures are formed. A first frontside contact disposed between dummy metal gate structures is formed over an isolation insulating layer. A frontside wiring layer is formed over the first frontside contact. A part of the substrate is removed from a backside of the substrate so that a bottom of the isolation insulating layer is exposed. A first opening is formed in the isolation insulating layer from the bottom of the isolation insulating layer to expose a bottom of the first frontside contact. A first backside contact is formed by filling the first opening with a conductive material to connect the first frontside contact. In one or more of the foregoing and/or following embodiments, a second frontside contact connected to the source or the drain of the FET is formed. In one or more of the foregoing and/or following embodiments, the front side wiring layer includes conductive connections between the first frontside contact and the second frontside contact. In one or more of the foregoing and/or following embodiments, a second opening is formed from the backside of the substrate to expose a bottom of the source or the drain of the FET, and a second backside contact is formed by filling the second opening with the conductive material to connect the second frontside contact. In one or more of the foregoing and/or following embodiments, a vertical length of the first frontside contact is greater than a vertical length of the second frontside contact. In one or more of the foregoing and/or following embodiments, a material of the first frontside contact is a same as a material of the first backside contact. In one or more of the foregoing and/or following embodiments, the first frontside contact is laterally offset from the FET. In one or more of the foregoing and/or following embodiments, the dummy metal gate structures include a gate dielectric layer and a metal gate electrode, and after the first opening is formed, the gate dielectric layer is exposed at a bottom the first opening.

In accordance with another aspect of the present disclosure, in a method of manufacturing a semiconductor device, a field effect transistor (FET) having a metal gate structure, a source and a drain is formed over a substrate. A first frontside contact disposed between dummy metal gate structures is formed over an isolation insulating layer and over a semiconductor fin structure protruding from the substrate. A frontside wiring layer is formed over the first frontside contact. A part of the substrate is removed from a backside of the substrate so that a bottom of the isolation insulating layer is exposed. A first opening is formed by etching the semiconductor fin structure from the backside of the substrate to expose a bottom of the first frontside contact. A first backside contact is formed by filling the first opening with a conductive material to connect the first frontside contact. In one or more of the foregoing and/or following embodiments, the dummy gate structures include a plurality of semiconductor sheets or wires vertically arranged, a gate dielectric layer wrapping around each of the plurality of semiconductor sheets or wires and a gate electrode formed over the gate dielectric layer. In one or more of the foregoing and/or following embodiments, the semiconductor fin structure includes a fin protruding from the substrate and an epitaxial layer formed on the fin. In one or more of the foregoing and/or following embodiments, the first frontside contact is formed over two semiconductor fin structures. In one or more of the foregoing and/or following embodiments, after the first opening is formed, a dielectric sidewall layer is formed over an inner sidewall of the first opening. In one or more of the foregoing and/or following embodiments, the dielectric sidewall layer is formed on a sidewall of the isolation insulating layer. In one or more of the foregoing and/or following embodiments, the first backside contact is in contact with the first backside contact and the isolation insulating layer. In one or more of the foregoing and/or following embodiments, a second frontside contact connected to the source or the drain of the FET is formed. In one or more of the foregoing and/or following embodiments, a second opening is formed from the backside of the substrate to expose a bottom of the source or the drain of the FET, and a second backside contact is formed by filling the second opening with the conductive material to connect the second frontside contact.

In accordance with another aspect of the present disclosure, in a method of manufacturing a semiconductor device, fin structures, in each of which first semiconductor layers and second semiconductor layers are alternately stacked over a bottom fin structure, are formed. Sacrificial gate structures including sacrificial gate electrodes are formed over the fin structures and an isolation insulating layer. Source/drain regions of the fin structures are recessed. A first epitaxial layer is formed over the recessed fin structures. A first dielectric layer is formed over the first epitaxial layer and the isolation insulating layer. A second epitaxial layer is formed on ends of the second semiconductor layers and over the first dielectric layer. A first interlayer dielectric (ILD) layer is formed over the second epitaxial layer. A metal gate structure of a gate-all-around field effect transistor (GAA FET) and dummy metal gate structures are formed. A second ILD layer is formed over the metal gate structure and the dummy metal gate structure. A first frontside contact disposed between the dummy metal gate structures is formed over the isolation insulating layer, and a second frontside contact disposed over the second epitaxial layer is formed. A frontside wiring layer is formed over the first and second frontside contacts. A support layer is formed over the frontside wiring layer. A part of the substrate is removed from a backside of the substrate so that a bottom of the isolation insulating layer is exposed. From the backside of the substrate, a first opening is formed to expose a bottom of the first frontside contact and a second opening is formed to expose a bottom of the second epitaxial layer. A first backside contact and a second backside contact are formed by filling the first opening and the second opening with a conductive material. In one or more of the foregoing and/or following embodiments, a backside wiring layer is formed over the first and second backside contacts. In one or more of the foregoing and/or following embodiments, a gate separation wall separating one or more of the metal gate structures and the dummy metal gate structure is formed.

In accordance with another aspect of the present disclosure, a semiconductor device includes a first field effect transistor (FET) and a second FET, each having a gate, a source and a drain, a frontside wiring layer disposed over the first and second FETs, and a backside wiring layer disposed below the first and second FETs. An output from the drain or the source of the first FET is coupled to the gate of the second FET through the backside wiring layer. In one or more of the foregoing and/or following embodiments, the output from the drain or the source of the first FET is coupled to the gate of the second FET through a first frontside wiring pattern of the frontside wiring layer, a first feedthrough (FT) contact coupled to the first frontside wiring pattern, a backside wiring pattern of the backside wiring layer coupled to the first FT contact, a second FT contact coupled to the backside wiring pattern, and a second frontside wiring pattern of the frontside wiring layer coupled to the second FT contact. In one or more of the foregoing and/or following embodiments, the frontside wiring pattern includes at least three wiring layers. In one or more of the foregoing and/or following embodiments, the backside wiring pattern includes at least two wiring layers. In one or more of the foregoing and/or following embodiments, each of the first and second FT contacts includes a first portion and a second portion made of a different conductive material than the first portion. In one or more of the foregoing and/or following embodiments, the output from the drain or the source of the first FET is coupled to the gate of the second FET through a bottom contact contacting a bottom of the source or the drain, a backside wiring pattern of the backside wiring layer coupled to the bottom contact, a feedthrough (FT) contact coupled to the backside wiring pattern, and a frontside wiring pattern of the frontside wiring layer coupled to the FT contact. In one or more of the foregoing and/or following embodiments, a vertical length of the bottom contact is smaller than a vertical length of the FT contact.

In accordance with another aspect of the present disclosure, a semiconductor device includes a field effect transistor (FET) including a gate electrode and a source/drain epitaxial layer, a source/drain contact disposed on an upper surface of the source/drain epitaxial layer, dummy gate structures, a frontside contact disposed between the dummy gate structures, a frontside wiring layer coupled to the source/drain contact and the frontside contact, a backside contact coupled to the frontside contact, and a backside wiring layer coupled to the backside contact so that the source/drain epitaxial layer is electrically coupled to the backside wiring layer. In one or more of the foregoing and/or following embodiments, the dummy gate structures include a dummy gate dielectric layer made of a same material as a gate dielectric layer of the FET and a dummy gate electrode layer made of a same material as the gate electrode of the FET, and include no semiconductor channel. In one or more of the foregoing and/or following embodiments, the backside contact is in contact with the dummy gate dielectric layer. In one or more of the foregoing and/or following embodiments, the frontside contact is separated by each of the dummy gate structure by at least two dielectric layers. In one or more of the foregoing and/or following embodiments, a structure of the FET and a gate structure of the dummy gate structure include semiconductor sheets or wires vertically arranged and a gate dielectric layer wrapping around each of the semiconductor sheets or wires, and the gate electrode disposed on the gate dielectric layer. In one or more of the foregoing and/or following embodiments, the backside contact is in contact with the gate dielectric layer of the dummy gate structure. In one or more of the foregoing and/or following embodiments, the dummy gate structure is electrically isolated. In one or more of the foregoing and/or following embodiments, the source/drain contact is made of a same material as the frontside contact. In one or more of the foregoing and/or following embodiments, a vertical length of the source/drain contact is smaller than a vertical length of the frontside contact.

In accordance with another aspect of the present disclosure, a semiconductor device includes a field effect transistor (FET) including a gate electrode and a source/drain epitaxial layer, a source/drain contact disposed on an upper surface of the source/drain epitaxial layer, dummy gate structures, frontside contacts disposed adjacent to the dummy gate structures with one or more dielectric layer therebetween, a frontside wiring layer coupled to the source/drain contact and at least one of the frontside contacts, a backside contact coupled to at least one of the frontside contacts, and a backside wiring layer coupled to the backside contact so that the source/drain epitaxial layer is electrically coupled to the backside wiring layer. In one or more of the foregoing and/or following embodiments, two of the frontside contacts are coupled to the backside contact. In one or more of the foregoing and/or following embodiments, one of the frontside contacts is electrically isolated. In one or more of the foregoing and/or following embodiments, the semiconductor device further includes a bottom source/drain contact connected to a bottom surface of the source/drain epitaxial layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a field effect transistor (FET) having a metal gate structure, a source and a drain over a substrate;
    forming dummy metal gate structures over the substrate;
    forming a first opening between the dummy metal gate structures;
    forming a dielectric liner layer on walls of the first opening;
    forming a first frontside contact in the first opening, between the dummy metal gate structures, and over an isolation insulating layer;
    forming a frontside wiring layer over the first frontside contact;
    removing a part of the substrate from a backside of the substrate so that a bottom of the isolation insulating layer is exposed;
    forming a second opening in the isolation insulating layer from the bottom of the isolation insulating layer to expose a bottom of the first frontside contact; and
    forming a first backside contact by filling the second opening with a conductive material to connect the first frontside contact,
    wherein the metal gate structure and the dummy metal gate structures of the semiconductor device include a plurality of semiconductor sheets or wires vertically arranged, a gate dielectric layer wrapping around each of the plurality of semiconductor sheets or wires, and a gate electrode formed over the gate dielectric layer, and
    the dielectric liner layer covers ends of the plurality of semiconductor sheets or wires of the dummy metal gate structures.

2. The method of claim 1, further comprising forming a second frontside contact connected to the source or the drain of the FET.

3. The method of claim 2, wherein the frontside wiring layer includes conductive connections between the first frontside contact and the second frontside contact.

4. The method of claim 2, further comprising:
    forming a third opening from the backside of the substrate to expose a bottom of the source or the drain of the FET; and
    forming a second backside contact by filling the third opening with the conductive material to connect the second frontside contact.

5. The method of claim 2, wherein a vertical length of the first frontside contact is greater than a vertical length of the second frontside contact.

6. The method of claim 1, wherein a material of the first frontside contact is same as a material of the first backside contact.

7. The method of claim 1, wherein the first frontside contact is laterally offset from the FET.

8. The method of claim 1, wherein:
    after the second opening is formed, the gate dielectric layer of at least one of dummy metal gate structures is exposed at a bottom the second opening.

9. A method of manufacturing a semiconductor device, comprising:
    forming a field effect transistor (FET) having a metal gate structure, a source and a drain over a substrate;
    forming dummy metal gate structures over the substrate;
    forming a first opening between the dummy metal gate structures;
    forming a dielectric liner layer on walls of the first opening;
    forming a first frontside contact in the first opening, between the dummy metal gate structures, over an isolation insulating layer, and over a semiconductor fin structure protruding from the substrate;
    forming a frontside wiring layer over the first frontside contact;
    removing a part of the substrate from a backside of the substrate so that a bottom of the isolation insulating layer is exposed;
    forming a second opening by etching the semiconductor fin structure from the backside of the substrate to expose a bottom of the first frontside contact; and
    forming a first backside contact by filling the second opening with a conductive material to connect the first frontside contact,
    wherein the metal gate structure and the dummy metal gate structures of the semiconductor device include a plurality of semiconductor sheets or wires vertically arranged, a gate dielectric layer wrapping around each of the plurality of semiconductor sheets or wires, and a gate electrode formed over the gate dielectric layer, and
    the dielectric liner layer covers ends of the plurality of semiconductor sheets or wires of the dummy metal gate structures.

10. The method of claim 9, wherein the semiconductor fin structure includes a fin protruding from the substrate and an epitaxial layer formed on the fin.

11. The method of claim 10, wherein the first frontside contact is formed over two semiconductor fin structures.

12. The method of claim 9, further comprising, after the second opening is formed, forming a dielectric sidewall layer over an inner sidewall of the second opening.

13. The method of claim 12, wherein the dielectric sidewall layer is formed on a sidewall of the isolation insulating layer.

14. The method of claim 9, wherein the first backside contact is in contact with the isolation insulating layer.

15. The method of claim 9, further comprising forming a second frontside contact connected to the source or the drain of the FET.

16. The method of claim 15, further comprising:
    forming a third opening from the backside of the substrate to expose a bottom of the source or the drain of the FET; and
    forming a second backside contact by filling the third opening with the conductive material to connect the second frontside contact.

17. A method of manufacturing a semiconductor device, comprising:
    forming a field effect transistor (FET) over a substrate, the FET including a metal gate structure, a source, and a drain;
    forming a plurality of dummy gate structures over the substrate;
    forming a first opening between a pair of dummy gate structures of the plurality of dummy gate structures;
    forming a dielectric liner layer on walls of the first opening;

forming a first frontside contact in the first opening and between the pair of dummy gate structures of the plurality of dummy gate structures;

forming a frontside wiring layer over the first frontside contact;

removing a portion of the substrate to form a second opening at a backside of the first frontside contact; and forming a first backside contact by filling the second opening with a conductive material connected to the first frontside contact, wherein the metal gate structure and the plurality of dummy gate structures of the semiconductor device include a plurality of semiconductor layers, a gate dielectric layer wrapping around the plurality of semiconductor layers, and a gate electrode formed over the gate dielectric layer, and the dielectric liner layer covers ends of the plurality of semiconductor layers of the dummy gate structures.

18. The method of claim 17, further comprising forming a second frontside contact connected to the source or the drain of the FET.

19. The method of claim 17, wherein the dielectric liner layer comprises silicon nitride or SiCN.

20. The method of claim 17, wherein the dielectric liner layer has a thickness ranging from 1.5 nm to 5 nm.

* * * * *